(12) United States Patent
Suk et al.

(10) Patent No.: US 11,557,504 B2
(45) Date of Patent: Jan. 17, 2023

(54) SEMICONDUCTOR DEVICE INCLUDING ISOLATION LAYERS AND METHOD OF MANUFACTURING THE SAME

(71) Applicant: SAMSUNG ELECTRONICS CO., LTD., Suwon-si (KR)

(72) Inventors: Sung Dae Suk, Hwaseong-si (KR); Sang Hoon Lee, Hwaseong-si (KR); Masuoka Sadaaki, Hwaseong-si (KR); Han Su Oh, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/410,149

(22) Filed: Aug. 24, 2021

(65) Prior Publication Data
US 2021/0384068 A1    Dec. 9, 2021

Related U.S. Application Data

(63) Continuation of application No. 16/915,050, filed on Jun. 29, 2020, now Pat. No. 11,101,166, which is a (Continued)

(30) Foreign Application Priority Data

Jan. 22, 2018  (KR) .......................... 10-2018-0007813

(51) Int. Cl.
| | | |
|---|---|---|
| *H01L 21/00* | (2006.01) | |
| *H01L 21/762* | (2006.01) | |
| *H01L 29/66* | (2006.01) | |
| *H01L 29/06* | (2006.01) | |
| *H01L 29/78* | (2006.01) | |

(Continued)

(52) U.S. Cl.
CPC .... *H01L 21/76232* (2013.01); *H01L 29/0673* (2013.01); *H01L 29/42392* (2013.01); *H01L 29/6653* (2013.01); *H01L 29/6681* (2013.01); *H01L 29/66439* (2013.01);
(Continued)

(58) Field of Classification Search
CPC .......... H01L 21/76232; H01L 29/0673; H01L 29/42392; H01L 29/66439; H01L 29/6653; H01L 29/66545; H01L 29/66553; H01L 29/6681; H01L 29/7853; H01L 29/78696
See application file for complete search history.

(56) References Cited

U.S. PATENT DOCUMENTS 6,444,539 B1   9/2002   Sun et al.
7,393,751 B1   7/2008   Luo et al.
(Continued)

*Primary Examiner* — Richard A Booth
(74) *Attorney, Agent, or Firm* — F. Chau & Associates, LLC

(57) ABSTRACT

A semiconductor device includes: a pair of wire patterns configured to extend in a first direction and formed on a substrate to be spaced apart from each other in a second direction, the pair of wire patterns disposed closest to each other in the second direction; a gate electrode configured to extend in the second direction on the substrate, the gate electrode configured to surround the wire patterns; and first isolation layers configured to extend in the first direction between the substrate and the gate electrode and formed to be spaced apart from each other in the second direction, the first isolation layers overlapping the pair of wire patterns in a third direction perpendicular to the first and second directions.

20 Claims, 15 Drawing Sheets

Related U.S. Application Data continuation of application No. 16/035,906, filed on Jul. 16, 2018, now Pat. No. 10,734,273.

(51) Int. Cl.
*H01L 29/423* (2006.01)
*H01L 29/786* (2006.01)

(52) U.S. Cl.
CPC .. *H01L 29/66545* (2013.01); *H01L 29/66553* (2013.01); *H01L 29/7853* (2013.01); *H01L 29/78696* (2013.01)

(56) References Cited

U.S. PATENT DOCUMENTS

| | | |
|---|---|---|
| 8,866,204 B2 | 10/2014 | Liu et al. |
| 9,147,616 B1 | 9/2015 | Jacob et al. |
| 9,281,402 B2 | 3/2016 | Tang et al. |
| 9,287,178 B2 | 3/2016 | Li et al. |
| 9,472,471 B1 | 10/2016 | Balakrishnan et al. |
| 9,484,461 B2 | 11/2016 | Ching et al. |
| 10,734,273 B2 | 8/2020 | Suk et al. |
| 2010/0127328 A1 | 5/2010 | Oh et al. |
| 2017/0062598 A1 | 3/2017 | Seo |
| 2017/0154788 A1 | 6/2017 | Basker et al. |
| 2018/0240711 A1* | 8/2018 | Chang ............... H01L 29/66795 |
| 2018/0261514 A1* | 9/2018 | Xie ....................... H01L 29/785 |
| 2018/0366463 A1 | 12/2018 | Cho et al. |
| 2019/0157444 A1 | 5/2019 | Yang et al. |
| 2019/0229011 A1 | 7/2019 | Suk et al. |
| 2020/0098915 A1 | 3/2020 | Cheng |
| 2020/0328107 A1 | 10/2020 | Suk et al. |
| 2022/0270934 A1* | 8/2022 | Pan ................. H01L 21/823814 |

* cited by examiner

SEMICONDUCTOR DEVICE INCLUDING ISOLATION LAYERS AND METHOD OF MANUFACTURING THE SAME

CROSS-REFERENCE TO RELATED APPLICATION

This application is a continuation of U.S. application Ser. No. 16/915,050, filed on Jun. 29, 2020, which is a continuation of U.S. application Ser. No. 16/035,906, filed on Jul. 16, 2018, now U.S. Pat. No. 10,734,273, issued Aug. 4, 2020, which claims priority under 35 U.S.C. § 119 to Korean Patent Application No. 10-2018-0007813, filed on Jan. 22, 2018, in the Korean Intellectual Property Office (KIPO), the disclosures of which are incorporated by reference herein in their entirety.

TECHNICAL FIELD

The present inventive concept relates to a semiconductor device having isolation layers and a method of manufacturing the same.

DISCUSSION OF RELATED ART

Semiconductor devices are becoming more miniaturized so that high-capacity, high-performance, and highly integrated devices can be fabricated. To increase the integration density of the semiconductor devices, research is being conducted to reduce sizes of the semiconductor devices and a distance between the semiconductor devices.

To achieve the miniaturization of the semiconductor devices, much attention has been paid to a multibridge-channel metal-oxide-semiconductor field-effect transistor (MBCFET) which includes a plurality of thin rectangular channels and a gate surrounding top, bottom, and side surfaces of the channels, and the channels are vertically stacked on a substrate. It may be necessary to electrically isolate the channels from the substrate to improve the performance of the MBCFET.

SUMMARY

Exemplary embodiments of the present inventive concept provide a semiconductor device having isolation layers configured to electrically isolate a substrate from a channel, and also provide a method of manufacturing the semiconductor device having the isolation layers.

A method of manufacturing a semiconductor device according to an exemplary embodiment of the present inventive concept includes: providing a substrate; forming a first sacrificial layer pattern and a preliminary stack structure on the substrate, wherein the first sacrificial layer pattern is in contact with the substrate, the preliminary stack structure is formed by alternately stacking first preliminary semiconductor patterns and second preliminary semiconductor patterns and includes an overhang portion which does not overlap the first sacrificial layer pattern, and a lowermost layer of the preliminary stack structure is formed as one of the second preliminary semiconductor patterns; and partially etching the lowermost layer of the preliminary stack structure to form a second sacrificial layer pattern and to form a stack structure having a bottom surface at which one of the first preliminary semiconductor patterns is exposed.

A method of manufacturing a semiconductor device according to an exemplary embodiment of the present inventive concept includes: providing a substrate; forming a stacked body on the substrate by alternately stacking first semiconductor layers and second semiconductor layers; forming a mask pattern on the stacked body, in which the mask pattern includes a mandrel pattern and spacer patterns formed on sidewalls of the mandrel pattern; etching the stacked body using the mask pattern as an etch mask to form a stack structure and a first trench disposed between the stack structure and a neighboring stack structure; forming a first liner in the first trench; removing the mandrel pattern to form a first preliminary trench exposing a top surface of the stack structure between the spacer patterns; anisotropically etching the stack structure using the spacer patterns as an etch mask and using a first preliminary sacrificial layer pattern, which is a lowermost layer of the stack structure, as an etch stop film to form fin-type structures each including first semiconductor patterns and second semiconductor patterns stacked alternately, and recessing the first preliminary trench to form a second preliminary trench between the fin-type structures; and forming a second liner in the second preliminary trench.

A semiconductor device according to an exemplary embodiment of the present inventive concept includes: a pair of wire patterns configured to extend in a first direction and formed on a substrate to be spaced apart from each other in a second direction, the pair of wire patterns disposed closest to each other in the second direction; a gate electrode configured to extend in the second direction on the substrate, the gate electrode configured to surround the wire patterns; and first isolation layers configured to extend in the first direction between the substrate and the gate electrode and formed to be spaced apart from each other in the second direction, the first isolation layers overlapping the pair of wire patterns in a third direction perpendicular to the first and second directions.

BRIEF DESCRIPTION OF THE DRAWINGS

Exemplary embodiments of the present inventive concept will be more clearly understood from the following detailed description taken in conjunction with the accompanying drawings, in which.

Figure 1:
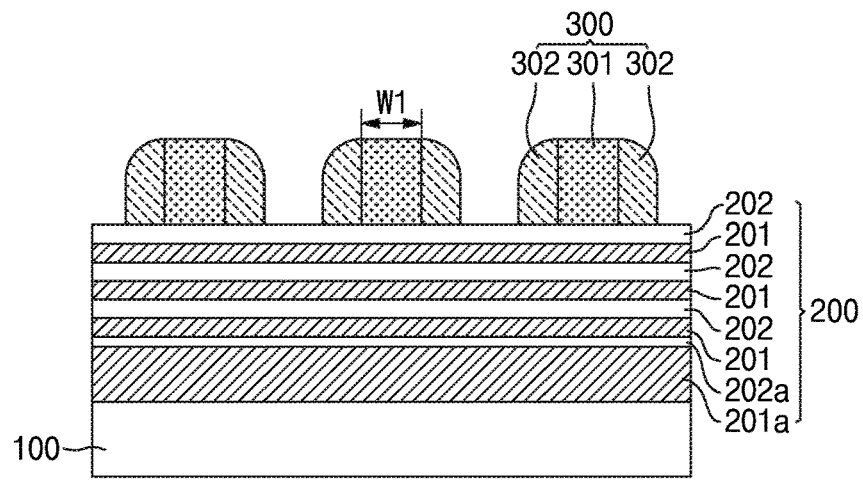
FIGS. 1 to 11 are cross-sectional views of intermediate operations for describing a method of manufacturing a semiconductor device according to an exemplary embodiment of the present inventive concept.

Since the drawings in FIGS. 1-38 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, a method of manufacturing a semiconductor device and the semiconductor device manufactured according to exemplary embodiments of the present inventive concept will be described with reference to the accompanying drawings.

FIGS. 1 to 11 are cross-sectional views of intermediate operations for describing a method of manufacturing a semiconductor device according to an exemplary embodiment of the present inventive concept.

Referring to FIG. 1, a stacked body 200 may be formed on a substrate 100 by alternately stacking first semiconductor layers 201 and second semiconductor layers 202.

The substrate 100 may be a bulk silicon (Si) substrate. Alternatively, the substrate 100 may be a germanium (Ge) substrate. Alternatively, the substrate 100 may include, for example, silicon germanium (SiGe), indium antimonide (InSb), lead telluride (PbTe), indium arsenide (InAs), indium phosphide (InP), gallium arsenide (GaAs), or gallium antimonide (GaSb). Alternatively, the substrate 100 may be a base substrate on which an epi layer is formed. In addition, the substrate 100 may include one or more semiconductor layers or structures and may include active or operable portions of semiconductor devices.

The stacked body 200 may be formed by alternately forming the second semiconductor layers 202 and the first semiconductor layers 201 on the first semiconductor layer 201 that is in contact with the substrate 100. That is, the lowermost layer of the stacked body 200 may be the first semiconductor layer 201. An uppermost layer of the stacked body 200 may be the second semiconductor layer 202. The first semiconductor layers 201 and the second semiconductor layers 202 may be formed using an epitaxial growth method. The first semiconductor layer 201 in contact with the substrate 100 may be a layer bonded to the substrate 100 using a wafer bonding process.

The first semiconductor layers 201 may include a material different from that of the second semiconductor layers 202. For example, the first semiconductor layers 201 and the second semiconductor layers 202 may include materials having etch selectivities different from each other. For example, the first semiconductor layers 201 may include a material having an etch selectivity with respect to the second semiconductor layers 202. That is, when the first semiconductor layers 201 are completely etched under a first etch condition, the second semiconductor layers 202 may not be etched or only slightly etched. Conversely, when the second semiconductor layers 202 are completely etched under a second etch condition different from the first etch condition, the first semiconductor layers 201 may not be etched or only slightly etched.

The first semiconductor layer 201 may include silicon germanium (SiGe) or germanium (Ge). Further, the second semiconductor layer 202 may include silicon (Si) or a Group III-V compound semiconductor. The Group III-V compound semiconductor may be one of, for example, a binary compound, a ternary compound, and a quaternary compound, and may be formed by combining at least one of, for example, aluminum (Al), gallium (Ga), and indium (In), which are Group III elements, and at least one of, for example, phosphorus (P), arsenic (As), and antimony (Sb), which are Group V elements.

The first semiconductor layer 201, which is the lowermost layer of the stacked body 200, in contact with the substrate 100 may be defined as a first sacrificial layer 201a, and the second semiconductor layer 202 in contact with the first sacrificial layer 201a may be defined as a second sacrificial layer 202a. The first sacrificial layer 201a and the second sacrificial layer 202a may be partially or entirely removed during a subsequent process, and one or more insulating films may be disposed in spaces from which the first sacrificial layer 201a and the second sacrificial layer 202a are removed in a subsequent process.

A thickness of each of the first semiconductor layer 201 and the second semiconductor layer 202 may be variously changed according to an exemplary embodiment of the present inventive concept. For example, the first semiconductor layer 201 may have a thickness smaller than or the same as that of the second semiconductor layer 202. Alternatively, the first semiconductor layer 201 may have a thickness larger than that of the second semiconductor layer 202. Further, the first sacrificial layer 201a may have a thickness greater than that of the first semiconductor layer 201 or that of the second semiconductor layer 202. The second sacrificial layer 202a may have a thickness smaller than that of the first semiconductor layer 201 or that of the second semiconductor layer 202.

The first semiconductor layer 201 may be removed during a subsequent process, and a gate dielectric film and a portion of a gate electrode may be disposed in a space from which the first semiconductor layer 201 is removed. Accordingly, a thickness of the first semiconductor layer 201 may be substantially equal to a distance in a vertical direction between adjacent ones of a plurality of nanosheets that provide a channel region in the semiconductor device.

Mask patterns 300 may be formed on a top surface of the stacked body 200. Each of the mask patterns 300 may include a mandrel pattern 301 and spacer patterns 302 on sidewalls of the mandrel pattern 301.

The mandrel patterns 301 may be formed to be spaced apart from each other and may extend in the vertical direction. The mandrel patterns 301 may be formed to have a width W1 measured in a horizontal direction and may be spaced apart from each other by a distance, and the width W1 and the distance may be obtained according to a resolution limit provided in a photolithography process. For example, the photolithography process may be an extreme ultraviolet (EUV) lithography process or an ArF (193 nm) immersion photolithography process. The width W1 of the mandrel patterns 301 and the distance between the mandrel patterns 301 may be greater than a minimum feature size of the semiconductor device to be described below.

The width W1 of the mandrel patterns 301 and the distance between the mandrel patterns 301 may be determined by a target width of line patterns to be finally implemented. In particular, the distance between the mandrel patterns 301 may be determined by the minimum feature size of the line patterns to be finally implemented. For example, to determine the distance between the mandrel patterns 301, a width of the spacer patterns 302 to be formed on the sidewalls of the mandrel pattern 301 may have to be considered. As an example, to form line patterns with 1:1 ratio line and space, the width of the spacer patterns 302 may need to be equal to the width W1 of the mandrel patterns 301. Thus, to form line patterns with 1:1 ratio line and space, the distance between the mandrel patterns 301 may be three times of the width W1 of the mandrel patterns 301. However, the line patterns may not have equal line and space. For example, the width of the spacer patterns 302 may be smaller than the width W1 of the mandrel patterns 301, and the distance between the mandrel patterns 301 may be less than three times of the width W1 of the mandrel patterns 301.

A top surface of the second semiconductor layer 202 that is the uppermost layer of the stacked body 200 may be exposed by as much as a width corresponding to the distance between the mandrel patterns 301. The mandrel pattern 301 may include a material having an etch selectivity with respect to the first semiconductor layer 201 and the second semiconductor layer 202.

A spacer layer may be conformally formed to cover a surface of the mandrel pattern 301 and an exposed surface of the stacked body 200. Thereafter, the spacer layer may be anisotropically etched back until the surface of the stacked body 200 is exposed, thereby forming spacer patterns 302 on both sidewalls of the mandrel pattern 301. Thus, the spacer patterns 302 may be formed to surround the mandrel patterns 301, but not to cover the top surface of the mandrel pattern 301. Upper portions of the spacer patterns 302 may be etched back and have a round shape.

The spacer patterns 302 and the mandrel pattern 301 may have an etch selectivity with respect to the second semiconductor layer 202, which is the uppermost layer of the stacked body 200. The width of the spacer patterns 302 may be set to be equal to the minimum feature size. For example, the width of the spacer patterns 302 may define the target width of line patterns to be finally implemented.

Figure 2:
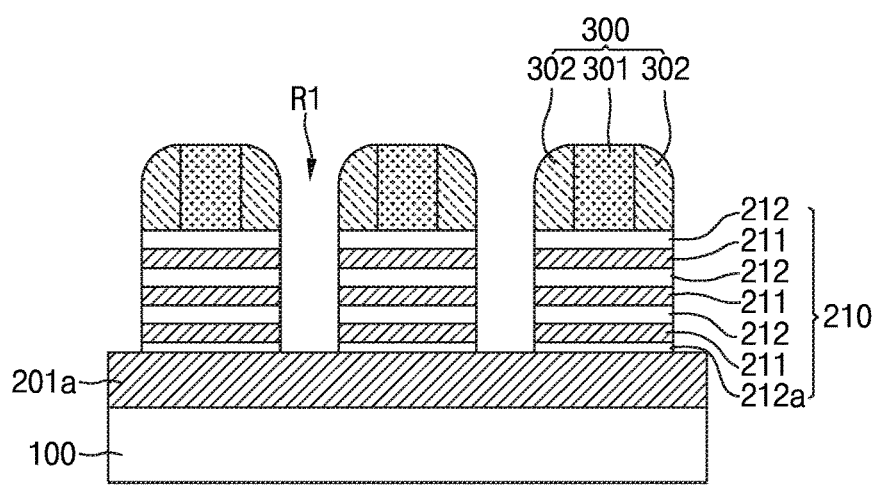

Referring to FIG. 2, a preliminary stack structure 210 may be formed on the first sacrificial layer 201a. The preliminary stack structure 210 may include the second preliminary sacrificial layer pattern 212a, first preliminary semiconductor patterns 211, and second preliminary semiconductor patterns 212 stacked alternately with the first preliminary semiconductor patterns 211. The second preliminary sacrificial layer pattern 212a may be formed as one of the second preliminary semiconductor patterns 212, except the thickness of the second preliminary sacrificial layer pattern 212a may be lower than the thickness or thicknesses of other second preliminary semiconductor patterns 212. The preliminary stack structure 210 may be formed by anisotropically etching the stacked body 200 using the mandrel pattern 301 and the spacer pattern 302 as etch masks, and the stacked body 200 may be etched until a top surface of the first sacrificial layer 201a is exposed. A first preliminary trench R1 may be formed between adjacent ones of the preliminary stack structures 210.

Figure 3:
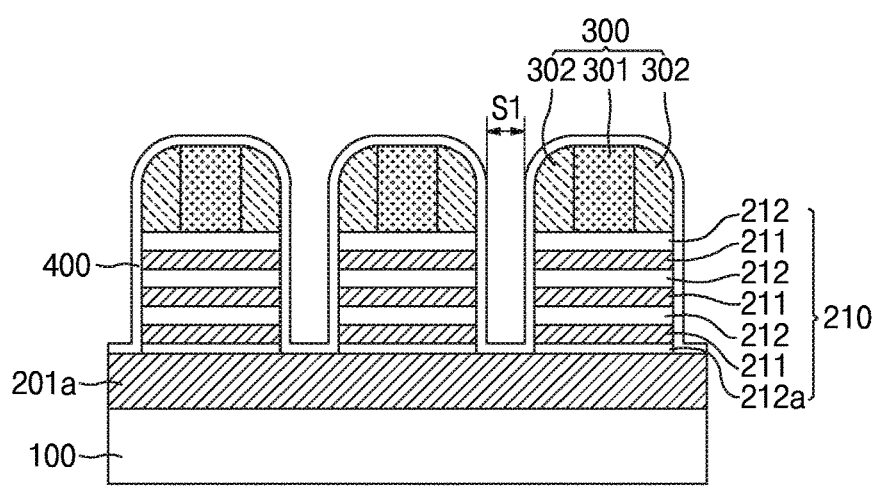
Figure 4:
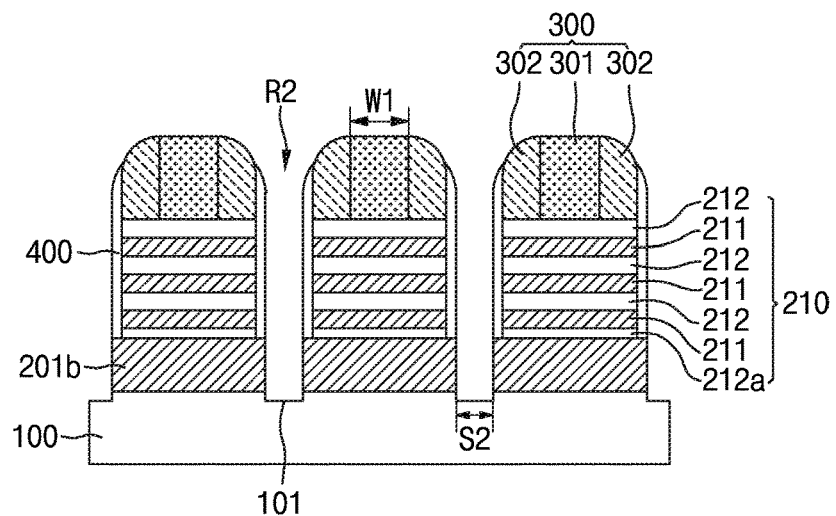

Referring to FIGS. 3 and 4, a first liner 400 may be formed to cover sidewalls of the preliminary stack structure 210, and may be conformally formed on the substrate 100. The first liner 400 may serve to prevent the preliminary stack structure 210 from being etched during a subsequent process. For example, the first liner 400 may include oxide or nitride. The first liner 400 may have an etch selectivity with respect to the preliminary stack structure 210. Thereafter, the first liner 400 in contact with the first sacrificial layer 201a may be anisotropically etched to expose the top surface of the first sacrificial layer 201a again.

Subsequently, the first sacrificial layer 201a of which the top surface is exposed through the first preliminary trench R1 may be anisotropically etched under the first preliminary trench R1 until a top surface of the substrate 100 is exposed, thereby forming a first trench R2. The first trench R2 may be formed by recessing the first preliminary trench R1 downward to the substrate 100. Further, the first sacrificial layer 201a may be anisotropically etched to form a first preliminary sacrificial layer pattern 201b. Side surfaces of the first preliminary sacrificial layer pattern 201b may be exposed by the first trench R2.

A top portion of the substrate 100 may be etched during the forming of the first trench R2. Thus, a concave unit 101 having a concave top surface may be formed in the top portion of the substrate 100. A width S2 measured in the horizontal direction of the concave unit 101 may be equal to a shortest distance S1 between the first liners 400 formed in different preliminary stack structures 210 adjacent to each other.

Figure 5:
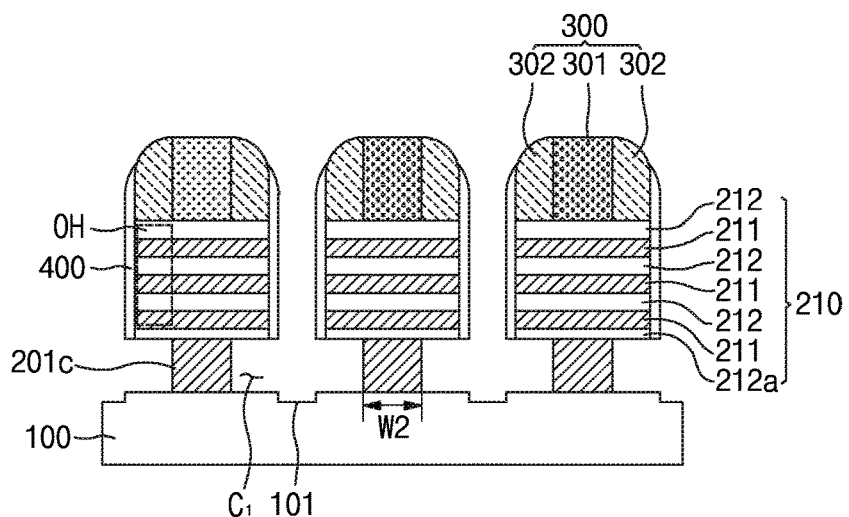
Figure 6:
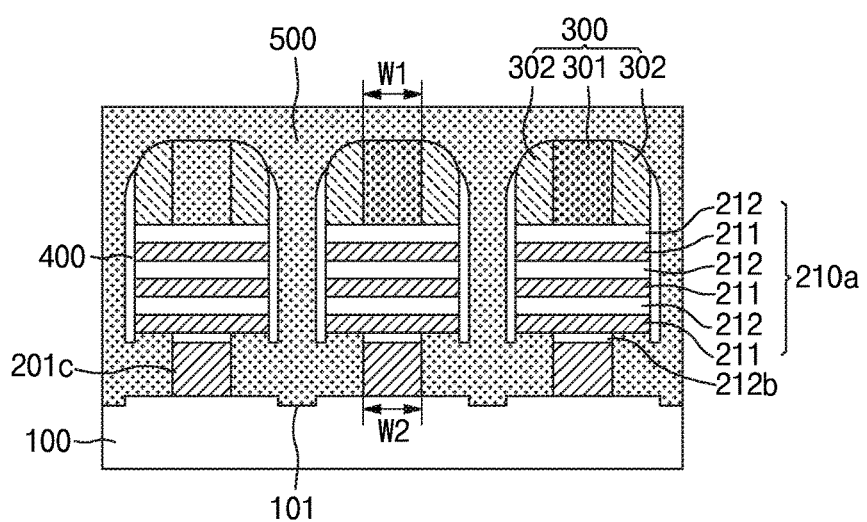

Referring to FIGS. 5 and 6, the first preliminary sacrificial layer pattern 201b may be laterally etched to form a first sacrificial layer pattern 201c. For example, the first preliminary sacrificial layer pattern 201b may be isotropically etched through the first trench R2 so that a width of the first preliminary sacrificial layer pattern 201b may be reduced to form the first sacrificial layer pattern 201c. The first preliminary semiconductor pattern 211 of the preliminary stack structure 210 may be protected by the second preliminary sacrificial layer pattern 212a, that is a lowermost layer of the preliminary stack structure 210, and the first liner 400, that is on the sidewall of the preliminary stack structure 210, during the isotropic etching process. A width W2 measured in the horizontal direction of the first sacrificial layer pattern 201c may be smaller than a width measured in the horizontal direction of the preliminary stack structure 210. Thus, the preliminary stack structure 210 may have an overhang portion OH which does not overlap the first sacrificial layer pattern 201c in the vertical direction. Further, the width W2 of the first sacrificial layer pattern 201c may be smaller than the width W1 of the mandrel patterns 301. Thus, the first sacrificial layer pattern 201c may be completely removed during a subsequent process of forming fin-type structures.

During the etching of side surfaces of the first preliminary sacrificial layer pattern 201b, a portion of a bottom surface of the second preliminary sacrificial layer pattern 212a in contact with the first preliminary sacrificial layer pattern 201b may be exposed. For example, the portion of the bottom surface of the second preliminary sacrificial layer pattern 212a in the overhang portion OH which does not overlap the first sacrificial layer pattern 201c may be exposed. Thus, the exposed portion of the second preliminary sacrificial layer pattern 212a may be etched to form the second sacrificial layer pattern 212b. The first sacrificial layer pattern 201c may have a thickness greater than a thickness or thicknesses of the first preliminary semiconductor patterns 211, and the second sacrificial layer pattern 212b may have a thickness smaller than the thickness or thicknesses of the first preliminary semiconductor patterns 211. A width of the second sacrificial layer pattern 212b may be equal to the width W2 of the first sacrificial layer pattern 201c. Further, the width of the second sacrificial layer pattern 212b may be equal to or less than the width W1 of the mandrel pattern 301. Thus, the second sacrificial layer pattern 212b may be completely removed together with the first sacrificial layer pattern 201c during a subsequent process of forming fin-type structures. During the formation of the first sacrificial layer pattern 201c and the second sacrificial layer pattern 212b, a stack structure 210a having the exposed first preliminary semiconductor pattern 211 may be formed on the second sacrificial layer pattern 212b. That is, a lowermost layer of the stack structure 210a may be the first preliminary semiconductor pattern 211 with a portion of its bottom surface being exposed. The exposed bottom surface may be the portion of the bottom surface of the first preliminary semiconductor pattern 211 in the overhang portion OH which does not overlap the second sacrificial layer pattern 212b. A vacant space $C_1$ may be formed first between the preliminary stack structure 210 and the substrate 100, and then between the stack structure 210a and the substrate 100. The first trench R2 may be recessed in a lateral direction of the first preliminary sacrificial layer pattern 201b, thereby forming a recessed first trench having the vacant space $C_1$.

Referring to FIGS. 6 to 9, a fin-type structure 220 and a first isolation layer 500 configured to support the fin-type structure 220 may be formed on the substrate 100.

The first isolation layer 500 may be formed to fill the recessed first trench. That is, the first isolation layer 500 may fill the vacant space $C_1$ between the stack structure 210a and the substrate 100. Further, the first isolation layer 500 may be formed to cover a top surface of the mandrel pattern 301.

Figure 7:
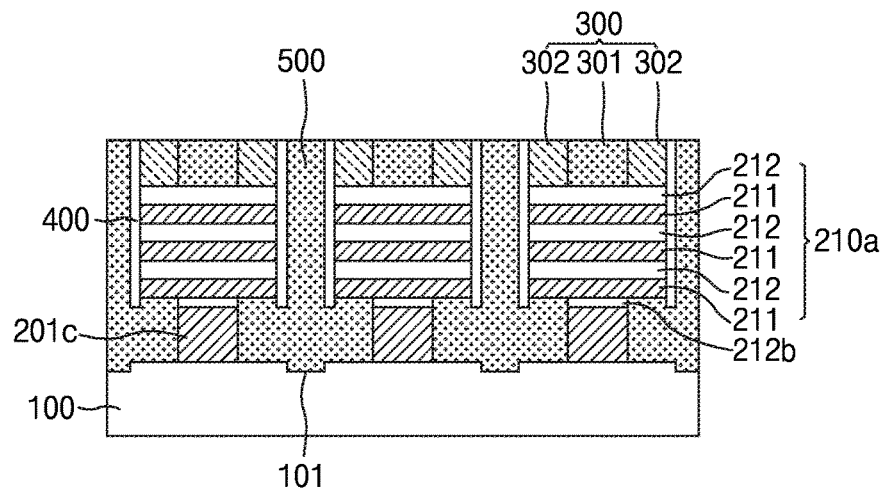
Figure 8:
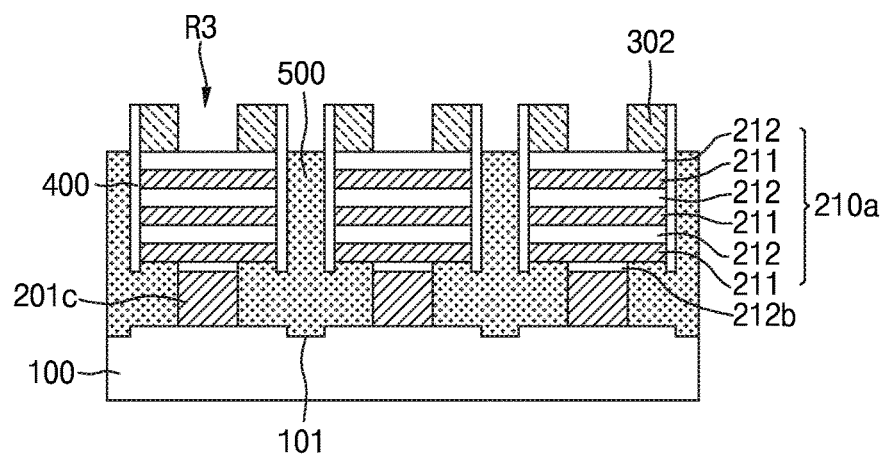
Figure 9:
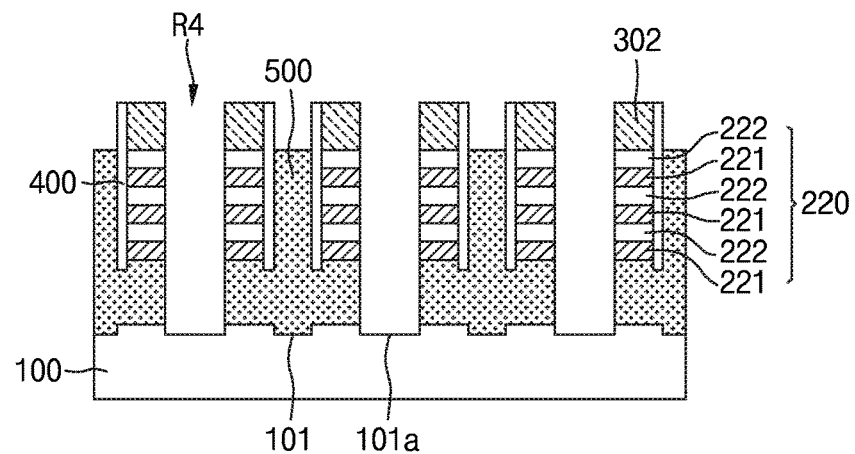

Subsequently, the first isolation layer 500 may be planarized to expose the top surface of the mandrel pattern 301. As shown in FIG. 7, in addition to the first isolation layer 500 being planarized, the spacer pattern 302, the mandrel pattern 301, and the first liner 400 may also be planarized to expose top surfaces of the first isolation layer 500, the spacer pattern 302, the mandrel pattern 301, and the first liner 400. The planarization process may be performed using a chemical mechanical polishing (CMP) process. Alternatively, an etch back process may be used in the planarization process.

The first isolation layer 500 may be formed of a material the same as that of the mandrel pattern 301. For example, the first isolation layer 500 may be formed of oxide.

Subsequently, the mandrel pattern 301 may be removed to form a second preliminary trench R3 between the spacer patterns 302. The mandrel pattern 301 and the first isolation layer 500 may be directionally etched using the spacer patterns 302 and the first liner 400 as etch masks. The etching process may be performed on the mandrel pattern 301 under the second preliminary trench R3 and between the spacer patterns 302 until a top surface of the stack structure 210a is exposed. For example, the etch process may be performed until the mandrel pattern 301 within the second preliminary trench R3 is completely removed, at the same time a portion of the first isolation layer 500 between adjacent first liners 400 may be recessed to a depth similar to that of the second preliminary trench R3. That is, the etching process may be performed until the second preliminary semiconductor pattern 212, which is an uppermost layer of the stack structure 210a, is exposed. If the first isolation layer 500 and the mandrel pattern 301 have very different etch rates, the first isolation layer 500 between the adjacent first liners 400 may be recessed to a depth different from that of the second preliminary trench R3.

Thereafter, a portion of the stack structure 210a, which is disposed under the second preliminary trench R3, may be directionally etched through the second preliminary trench R3. Further, the second sacrificial layer pattern 212b and the first sacrificial layer pattern 201c, which are sequentially exposed after the stack structure 210a is etched, may also be etched during the etching process. Thus, the second preliminary trench R3 may extend downward to form a second trench R4. Since each of widths of the first sacrificial layer pattern 201c and the second sacrificial layer pattern 212b is smaller than the width of the second preliminary trench R3, the first sacrificial layer pattern 201c and the second sacrificial layer pattern 212b may be completely removed by the etching process.

The etching process may be performed until the top surface of the substrate 100 is exposed. A portion of the substrate 100 may be etched by the etching process to form a concave unit 101a having a concave top surface. A width of the concave unit 101a may be equal to or smaller than the width W1 of the mandrel pattern 301.

One stack structure 210a may be separated by the second trench R4 to form two fin-type structures 220. The first isolation layer 500 may be formed between the fin-type structure 220 and the substrate 100 and may support the fin-type structure 220.

One sidewall of the fin-type structure 220 may be covered by the first liner 400, while another sidewall of the fin-type structure 220 may be exposed by the second trench R4. First semiconductor patterns 221 and second semiconductor patterns 222 may be covered by the first liner 400 at one sidewall of the fin-type structure 220 and may be exposed by the second trench R4 at another sidewall of the fin-type structure 220. A pair of fin-type structures 220, which are disposed closest to each other in a direction in which the pair of fin-type structures 220 are spaced apart from each other, have sidewalls covered by the first liner 400, and the sidewalls of the pair of fin-type structures 220 may face each other. Alternatively, exposed sidewalls of the first and second semiconductor patterns 221 and 222 in one fin-type structure 220 may face exposed sidewalls of the second semiconductor patterns 221 and 222 of a neighboring fin-type structures 220.

Figure 10:
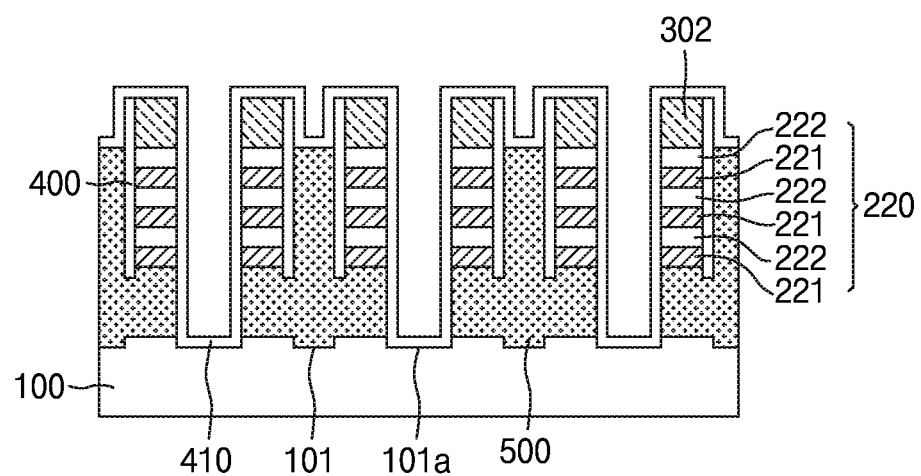

Referring to FIG. 10, a second liner 410 may be conformally formed in the second trench R4, and may cover the exposed sidewall of the fin-type structure 220 and exposed top surface of the substrate 100. Further, the second liner 410 may cover surfaces of the spacer pattern 302, the first liner 400, and the first isolation layer 500. The second liner 410 may be etched during a subsequent process of etching the first liner 400. The first liner 400 and the second liner 410 may protect the sidewalls of the fin-type structure 220 during the etching process.

Subsequently, a second isolation layer 510 may be formed to fill the second trench R4. The second isolation layer 510 may be formed in the second trench R4 to contact the second liner 410. That is, a bottom surface and side surfaces of the second isolation layer 510 may be surrounded by the second liner 410. The second isolation layer 510 may be formed to fill the second trench R4 up to a top surface of the second liner 410.

Subsequently, the second isolation layer 510, the first liner 400, the second liner 410, and the spacer pattern 302 may be planarized to expose the top surface of the fin-type structure 220. For example, the top surface of the fin-type structure 220 may be a top surface of the second semiconductor pattern 222.

Figure 11:
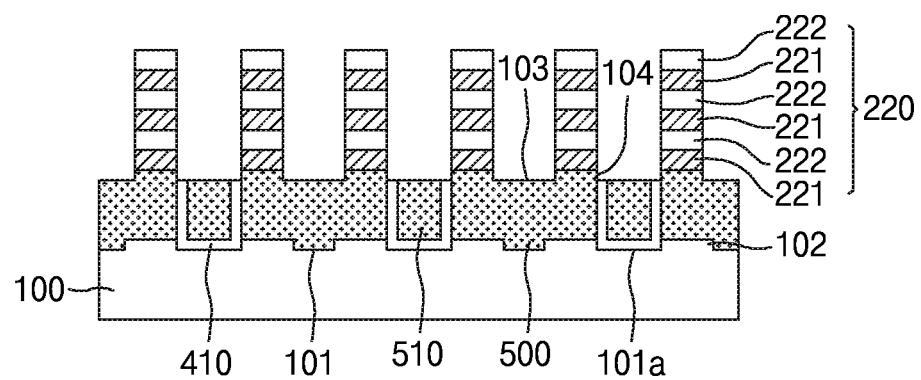

Referring to FIG. 11, the second isolation layer 510, the first liner 400, and the second liner 410 may be anisotropically etched using the top surface of the fin-type structure 220 as an etch mask. Thus, the side surfaces and top surface of the fin-type structure 220 may be exposed. For example, when the second isolation layer 510 is etched, the first liner 400 and the second liner 410 may also be etched.

The anisotropic etching process may be performed down to a depth at which the first liner 400 is completely removed. Due to the etching process, the top portion of the first isolation layer 500 may be partially etched. Thus, the top surface of the first isolation layer 500 may have a convex-concave shape. A concave unit 103 and a convex unit 104 may be formed in the top portion of the first isolation layer 500. Thus, the concave unit 101 may be formed in the top portion of the substrate 100 and the concave unit 103 may be formed in the top portion of the first isolation layer 500, in which the concave unit 101 formed in the substrate 100 may have a width smaller than a width of the concave unit 103 formed in the first isolation layer 500.

Alternatively, the etching process may be performed down to a bottom surface of the fin-type structure 220. Thus, a portion of the first liner 400 may remain on the first isolation layer 500. Due to the etching process, the top surface of the second liner 410 may be formed at a level the same as or lower than a level of the bottom surface of the fin-type structure 220.

As shown in FIG. 11, an electrical isolation by interposing the first isolation layer 500 between the fin-type structures 220 and the substrate 100 may be established to secure the performance of a semiconductor device, for example, an MBCFET, in the method of manufacturing the semiconductor device according to the exemplary embodiment of the present inventive concept described above.

FIGS. 12 to 20 are cross-sectional views of intermediate operations for describing a method of manufacturing a semiconductor device according to an exemplary embodiment of the present inventive concept. The description of components of the present exemplary embodiment that are the same as those of the above-described exemplary embodiment will be omitted or briefly described.

Figure 12:
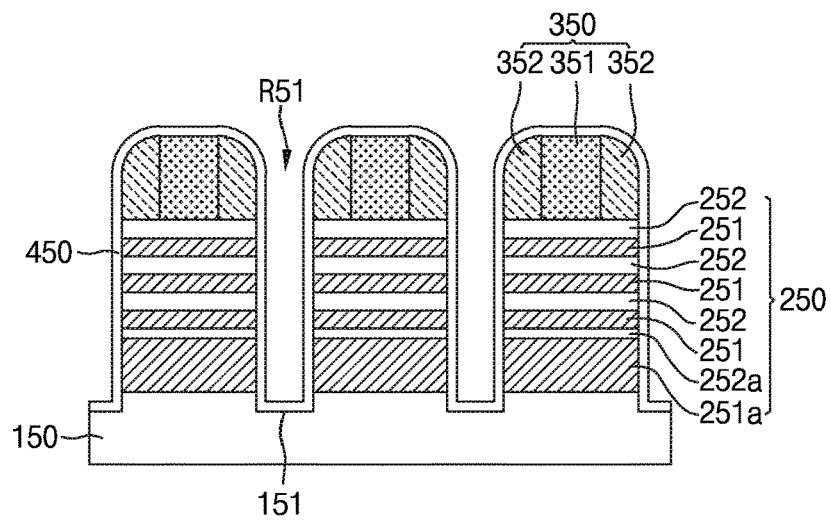
FIGS. 12 to 20 are cross-sectional views of intermediate operations for describing a method of manufacturing a semiconductor device according to an exemplary embodiment of the present inventive concept.

Referring to FIG. 12, stack structures 250 may be formed on a substrate 150. Each of the stack structures 250 may include a first preliminary sacrificial layer pattern 251a, a second preliminary sacrificial layer pattern 252a, first preliminary semiconductor patterns 251, and second preliminary second patterns 252 stacked alternately with the first preliminary semiconductor patterns 251.

The stack structure 250 may be formed by anisotropically etching a stacked body using a mask pattern 350 as an etch mask. The mask pattern 350 may include a mandrel pattern 351 and a spacer pattern 352.

The stack structure 250 may be formed by etching the stacked body until a top surface of the substrate 150 is exposed. The substrate 150 may be etched during the etching process so that a concave unit 151 may be formed in the top portion of the substrate 150. The stack structures 250 may be spaced a predetermined distance from each other, and a first trench R51 may be formed between the stack structures 250.

Thereafter, a first liner 450 may be formed to cover sidewalls of the stack structure 250, and may be conformally formed on the substrate 150. The first liner 450 may cover a surface of the mandrel pattern 351, a surface of the spacer pattern 352, side surfaces of the stack structure 250, and a top surface of the exposed substrate 150.

Figure 13:
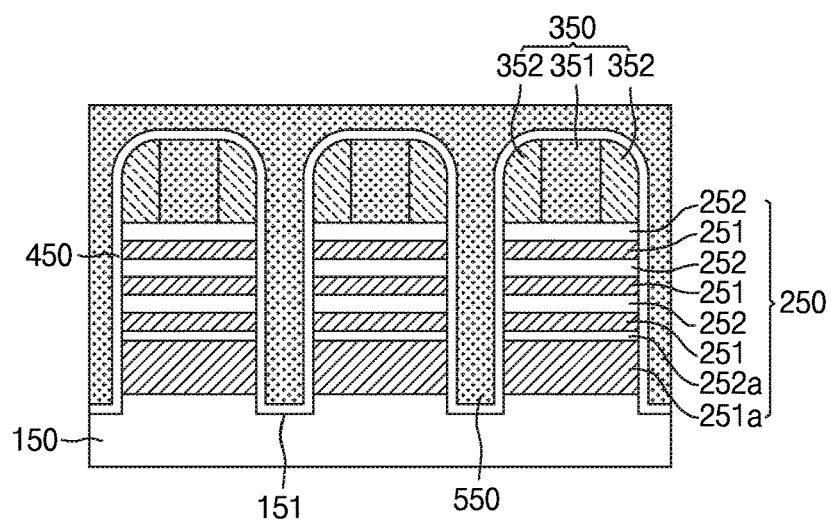

Referring to FIG. 13, a first isolation layer 550 may be formed in the first trench R51, and may be formed to cover the entire first liner 450 formed on the substrate 150. Thereafter, top surfaces of the mandrel patterns 351 may be exposed by the same planarization process as described above with reference to FIG. 7. Further, due to the planarization process, levels of the top surfaces of the first isolation layer 550, the first liner 450, the spacer pattern 352, and the mandrel pattern 351 may be equal to each other.

Figure 14:
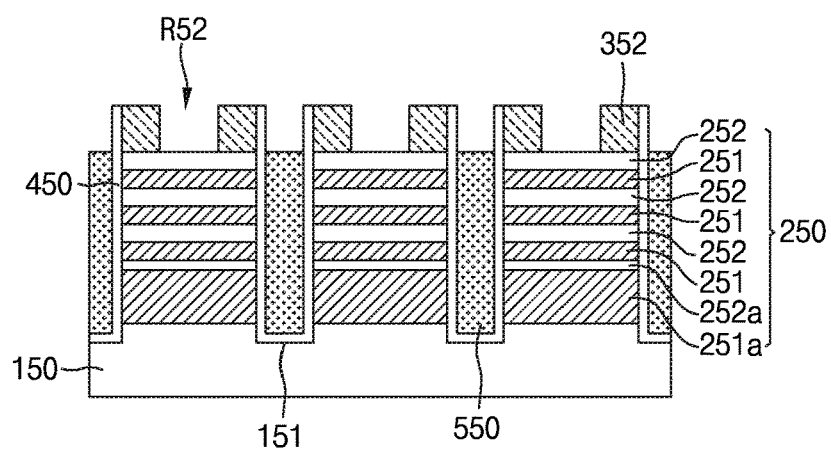

Referring to FIG. 14, a first preliminary trench R52 may be formed by the same etching process as described above with reference to FIG. 8. The first preliminary trench R52 may be formed between the spacer patterns 352 and may expose a top surface of the stack structure 250.

Figure 15:
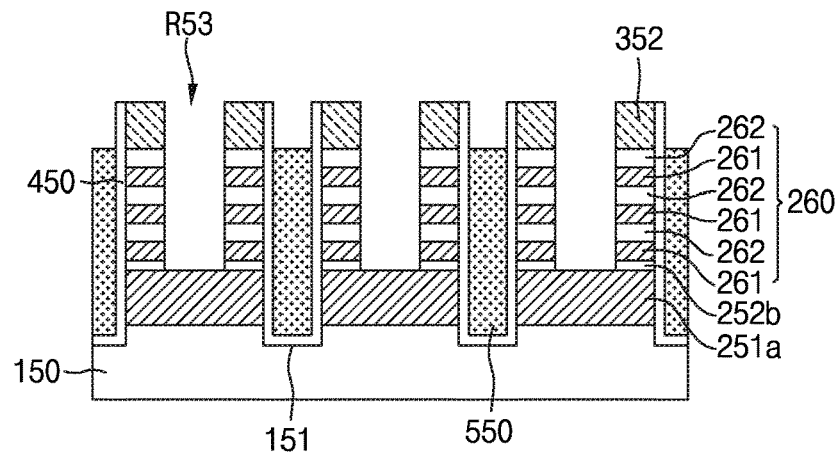

Referring to FIG. 15, a portion of the stack structure 250 under the first preliminary trench R52 may be etched through the first preliminary trench R52, thereby forming a second trench R53. The etching process may be performed until a top surface of the first preliminary sacrificial layer pattern 251a is exposed. Thus, the second trench R53 may be formed by recessing the first preliminary trench R52 downward to the top surface of the first preliminary sacrificial layer pattern 251a.

Fin-type structures 260 may be formed on the second preliminary sacrificial layer pattern 252a by the etching process. Each of the fin-type structures 260 may include first semiconductor patterns 261 and second semiconductor patterns 262 that are stacked alternately. Further, the fin-type structures 260 may be spaced a constant distance from each other by the second trenches R53. In addition, during the forming of the second trench R53, the second preliminary sacrificial layer pattern 252a may be etched to form a second sacrificial layer pattern 252b. One stack structure 250 may form two fin-type structures 260 by the etching process.

Figure 16:
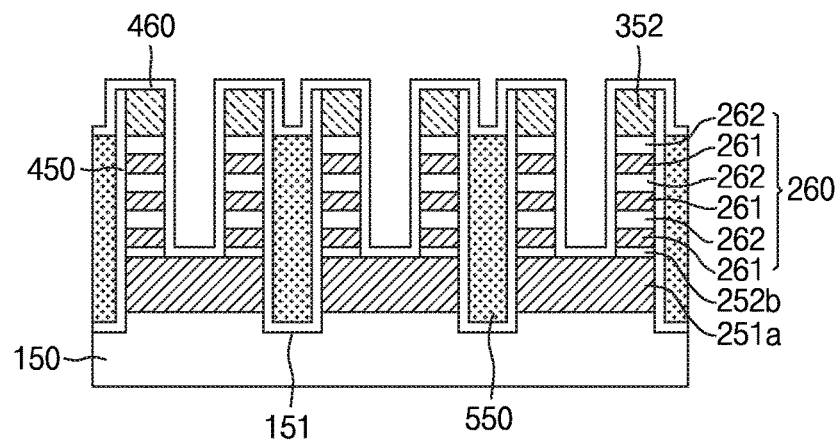

Referring to FIG. 16, a second liner 460 may be conformally formed on the substrate 150, and may be formed in the second trenches R53 to cover exposed sidewalls of the fin-type structure 260. Further, the second liner 460 may cover exposed sidewalls of the second sacrificial layer pattern 252b and an exposed top surface of the first preliminary sacrificial layer pattern 251a. In addition, the second liner 460 may cover top surfaces of the first isolation layer 550, the first liner 450, and the spacer pattern 352, and exposed sidewalls of the first liner 450.

Figure 17:
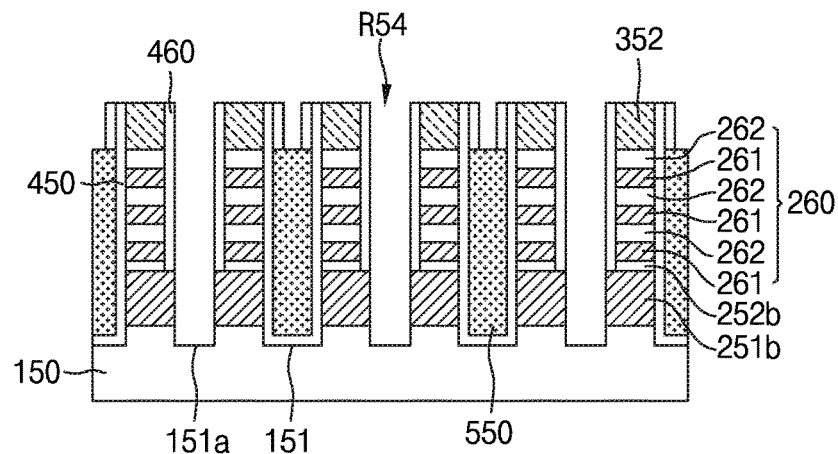

Referring to FIG. 17, the second liner 460 and the first preliminary sacrificial layer pattern 251a may be sequentially etched to form a second trench R54. For example, the second liner 460 may be anisotropically etched to expose a top surface of the first preliminary sacrificial layer pattern 251a. Thereafter, a pattern of the first preliminary sacrificial layer 251a having the exposed top surface may be anisotropically etched to expose a top surface of the substrate 150, and to form the second trench R54 and a first sacrificial layer pattern 251b. A portion of the substrate 150 may be etched during the forming of second trench R54. A concave groove 151a may be formed in the top portion of the substrate 150 due to the etching process.

Figure 18:
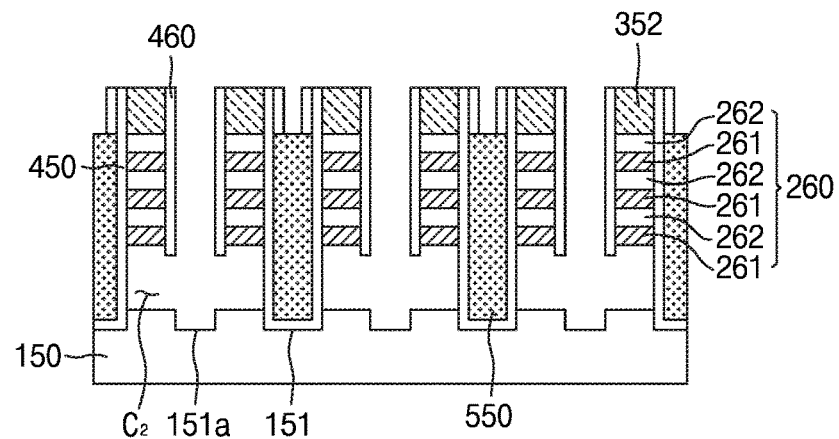

Referring to FIG. 18, the first sacrificial layer pattern 251b may be laterally etched. Side surfaces of the first sacrificial layer pattern 251b may be exposed by the second trench R54. The exposed side surfaces of the first sacrificial layer pattern 251b may be isotropically etched to remove the first sacrificial layer pattern 251b. Thus, a bottom surface of the second sacrificial layer pattern 252b in contact with the first sacrificial layer pattern 251b may be exposed. Further, the second sacrificial layer pattern 252b of which the bottom surface is exposed may be removed by an isotropic etching process. That is, the second trench R54 may be recessed in a lateral direction of the second sacrificial layer pattern 252b to form a recessed second trench R54. Thus, a bottom surface of the fin-type structure 260 may be exposed, and a vacant space $C_2$ may be interposed between the fin-type structure 260 and the substrate 150.

Figure 19:
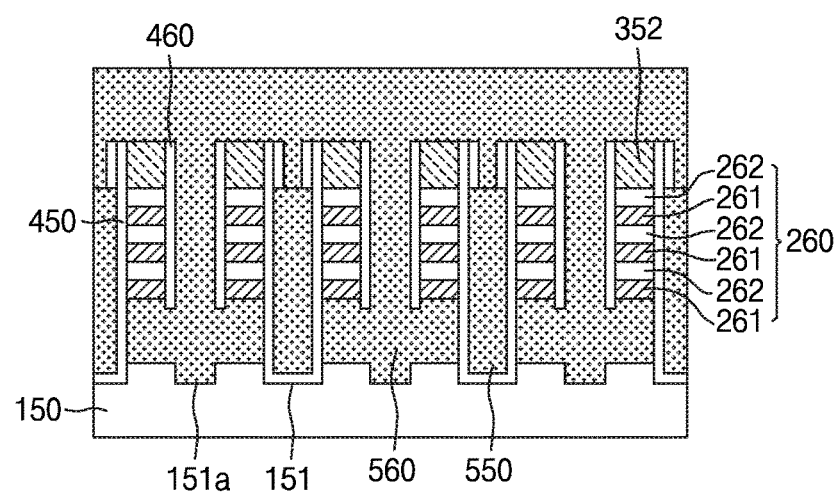

Referring to FIG. 19, a second isolation layer 560 may be formed to fill the second trench R54 having the vacant space $C_2$, and may be formed to be in contact with the second liner 460 in the second trench R54. Further, the second isolation layer 560 may be formed to be in contact with the first liner 450 and bottom surface of the fin-type structure 260 in the vacant space C2, and may be formed to cover top surfaces of the first liner 450, the second liner 460, and the spacer pattern 352.

Thereafter, the second isolation layer 560, the first liner 450, the second liner 460, and the spacer pattern 352 may be planarized to expose the top surface of the fin-type structure 260. For example, the top surface of the fin-type structure 260 may be a top surface of the second semiconductor pattern 262. As a result, top surfaces of the first isolation layer 550, the second isolation layer 560, the first liner 450, the second liner 460, and the second semiconductor pattern 262 may be at the same level.

Figure 20:
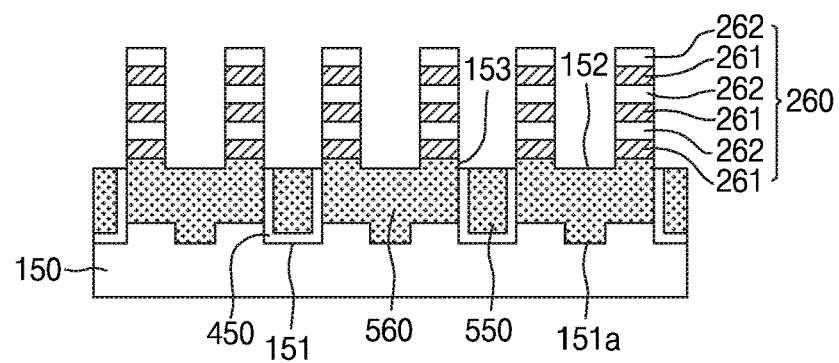

Referring to FIG. 20, the first isolation layer 550, the second isolation layer 560, the first liner 450, and the second liner 460 may be anisotropically etched using the top surface of the fin-type structure 260 as an etch mask. Thus, the fin-type structure 260 having an exposed top surface and side surfaces may be formed. For example, when the second isolation layer 560 is etched, the first liner 450 and the second liner 460 may be etched.

The anisotropic etching process may be performed down to a depth at which the second liner 460 is completely removed. Alternatively, the etching process may be performed down to the bottom surface of the fin-type structure 260. Thus, a portion of the second liner 460 may remain on the first isolation layer 550. The top surface of the first liner 450 may be formed at a level the same as or lower than that of the bottom surface of the fin-type structure 260.

The second isolation layer 560 may be partially etched by the etching process. During the etching of the second isolation layer 560, a concave groove 152 may be formed in a top portion of the second isolation layer 560. During the formation of the groove 152, protrusions 153 of which top surfaces are at a level higher than that of the groove 152 may be formed on both sides of the groove 152. Thus, the groove 151a may be formed in the top portion of the substrate 100 and the groove 152 may be formed in the top portion of the second isolation layer 560, in which the groove 151a formed in the substrate 100 may have a width smaller than a width of the groove 152 formed in the second isolation layer 560.

As shown in FIG. 20, an electrical isolation by interposing the second isolation layer 560 between the fin-type structures 260 and the substrate 150 may be established to secure the performance of a semiconductor device, for example, an MBCFET, in the method of manufacturing the semiconductor device according to the exemplary embodiment of the present inventive concept described above.

FIGS. 21 to 27 are perspective views of intermediate operations for illustrating a method of manufacturing a semiconductor device according to an exemplary embodiment of the present inventive concept, which are performed after the operations of FIG. 11 or FIG. 20. FIGS. 21 to 27 may illustrate a method of manufacturing a semiconductor device, which is performed after the operations of FIG. 11. Alternatively, FIGS. 21 to 27 may illustrate a method of manufacturing a semiconductor device, which is performed after the operations of FIG. 20. FIG. 28 shows cross-sectional views taken along lines I-I' and II-II' of the semiconductor device of FIG. 27.

Figure 21:
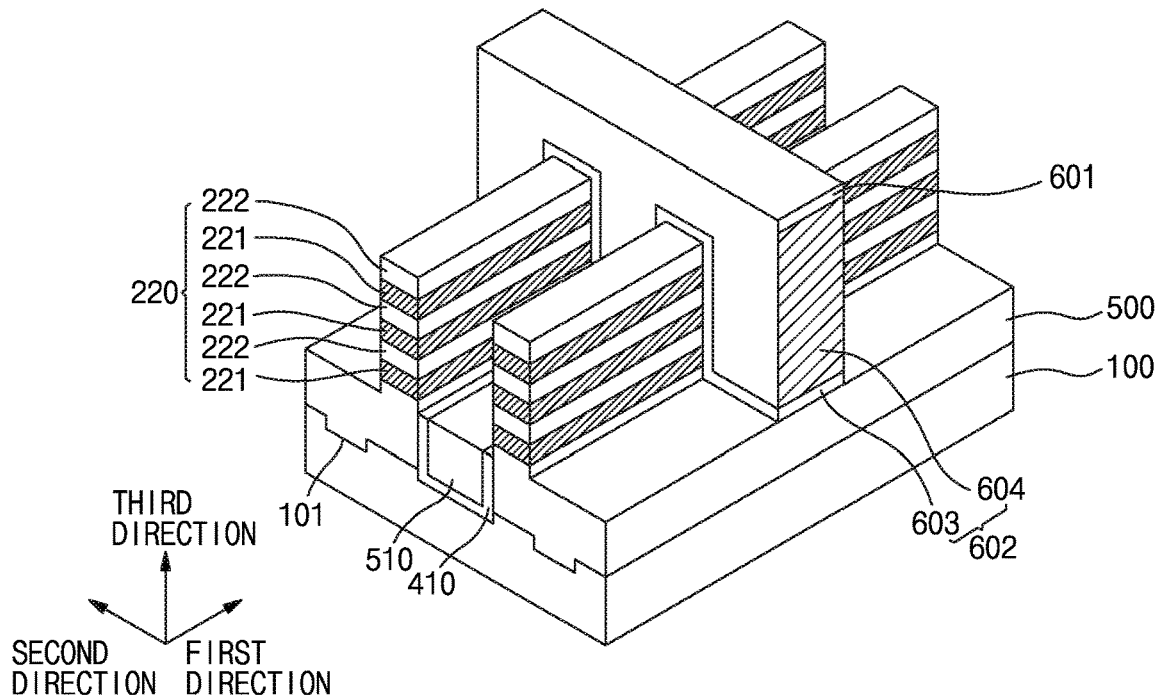
FIGS. 21 to 27 are perspective views of intermediate operations for describing a method of manufacturing a semiconductor device according to an exemplary embodiment of the present inventive concept, which are performed after the operations of FIG. 11 or FIG. 20.

Referring to FIG. 21, an etching process may be performed using a mask layer 601 so that a dummy gate pattern 602 may be formed to extend in a second direction that intersects fin-type structures 220 which extend in a first direction. The dummy gate pattern 602 may be formed on the fin-type structures 220, and may include a dummy gate insulating film 603 and a dummy gate electrode 604. For example, the dummy gate insulating film 603 may include a silicon oxide ($SiO_2$) film, and the dummy gate electrode 604 may include polysilicon (poly-Si) or amorphous silicon (a-Si).

Figure 22:
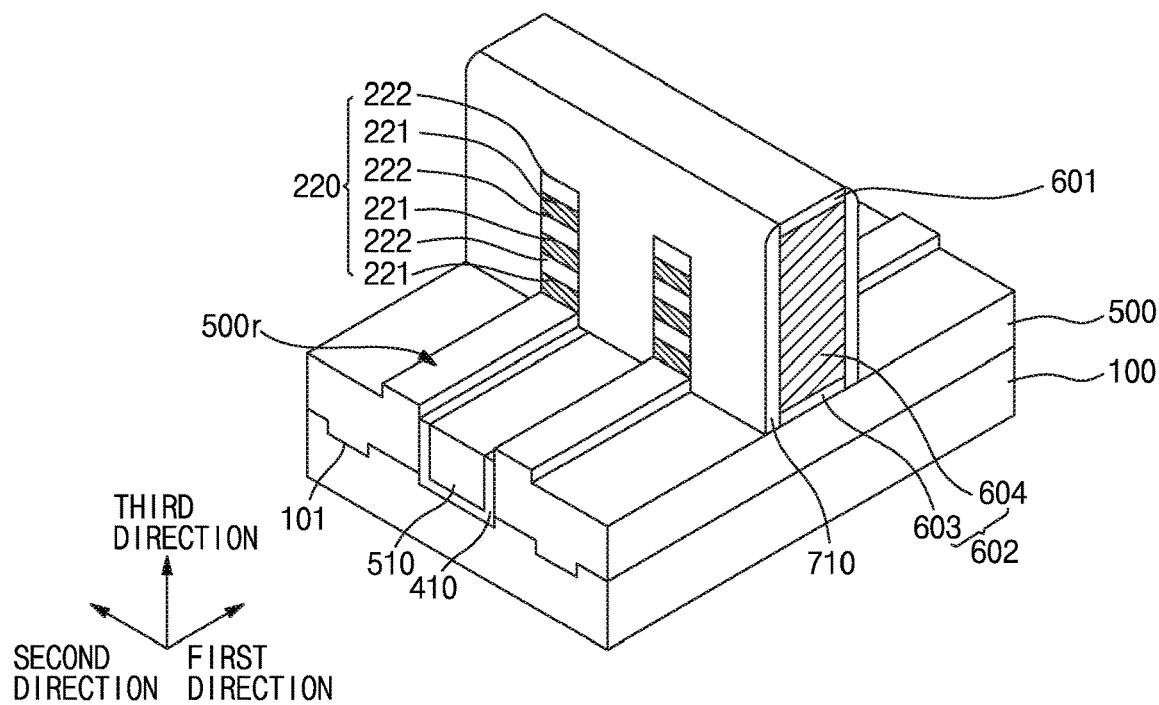

Referring to FIG. 22, outer spacers 710 may be formed on sidewalls of the dummy gate pattern 602. That is, the outer spacers 710 may be formed on sidewalls of the dummy gate insulating film 603 and the dummy gate electrode 604. For example, a first spacer film may be conformally formed on a first isolation layer 500 and a second isolation layer 510 to cover the dummy gate pattern 602 and the fin-type structures 220. Thereafter, the first spacer film may be directionally etched back so that the outer spacers 710 may be formed on sidewalls of the dummy gate pattern 602.

A portion of the fin-type structure 220, which does not overlap the dummy gate electrode 604 and the outer spacers 710, may be removed by an anisotropic etching process using the dummy gate pattern 602 as an etch mask. Thus, a recess 500r may be formed in the fin-type structure 220. A bottom surface of the recess 500r may be a portion protruding from the first isolation layer 500. The recess 500r may correspond to the protrusion 153 shown in FIG. 20. Although the formation of the outer spacers 710 is performed simultaneously with the formation of the recess 500r, the present inventive concept is not limited thereto. For example, after the outer spacers 710 are formed, a portion of the fin-type structure 220 may be removed to form the recess 500r.

During the formation of the recess 500r, portions of a first semiconductor pattern 221 and a second semiconductor pattern 222, which do not overlap the dummy gate electrode 604 and the outer spacers 710, may be removed. Thus, the first semiconductor pattern 221 and the second semiconductor pattern 222, which overlap the dummy gate electrode 604 and the outer spacers 710, may be formed. The second semiconductor pattern 222, which overlaps the dummy gate electrode 604 and the outer spacers 710, may be referred to as a wire pattern 222.

Figure 23:
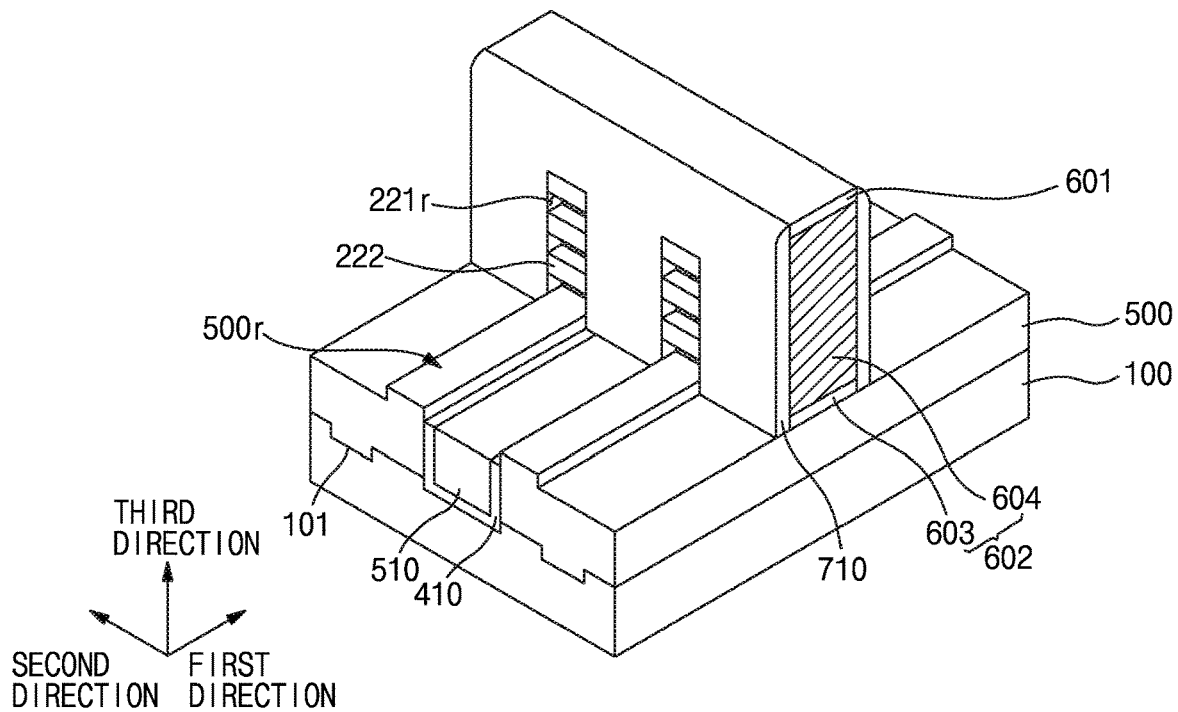

Referring to FIG. 23, portions of the first semiconductor pattern 221, which overlap the outer spacers 710, may be removed. Thus, a dimple 221r may be formed between the outer spacers 710 and the wire pattern (the second semiconductor pattern) 222. The dimple 221r may be recessed inward from an exposed side surface of the wire pattern 222 in the first direction.

The dimple 221r may be formed by, for example, a selective etching process. Specifically, the dimple 221r may be formed by an etching process using an etchant having an etch rate with respect to the first semiconductor pattern 221 higher than an etch rate with respect to the wire pattern 222.

Figure 24:
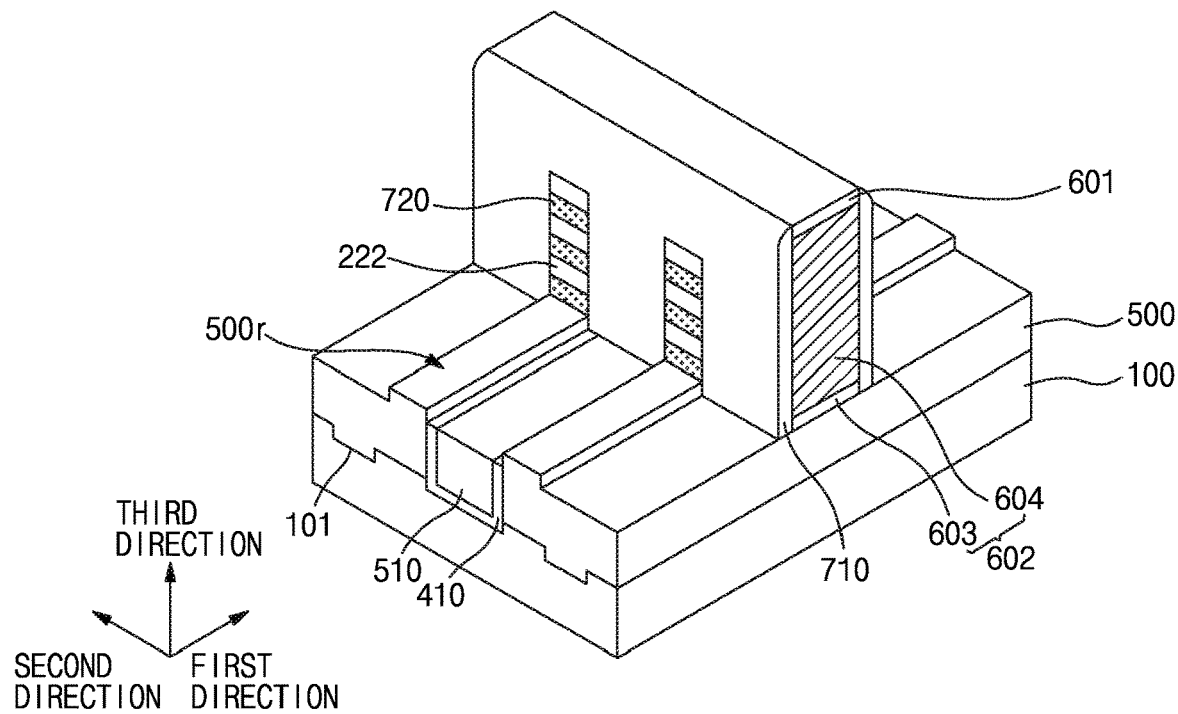

Referring to FIG. 24, the dimple 221r may be filled with an insulating material to form inner spacers 720. For example, a second spacer film may be formed to fill the dimple 221r, and may include a material having high gap-fill capability. The second spacer film may be formed on the first isolation layer 500, the second isolation layer 510, and a first liner 410.

Subsequently, the second spacer film may be etched using an etching process until a top surface of the wire pattern 222, which does not overlap the dummy gate pattern 602 and the outer spacers 710, is exposed, thereby forming the inner spacers 720. Thus, gate spacers 700 including the outer spacers 710 and the inner spacers 720 may be formed.

Figure 25:
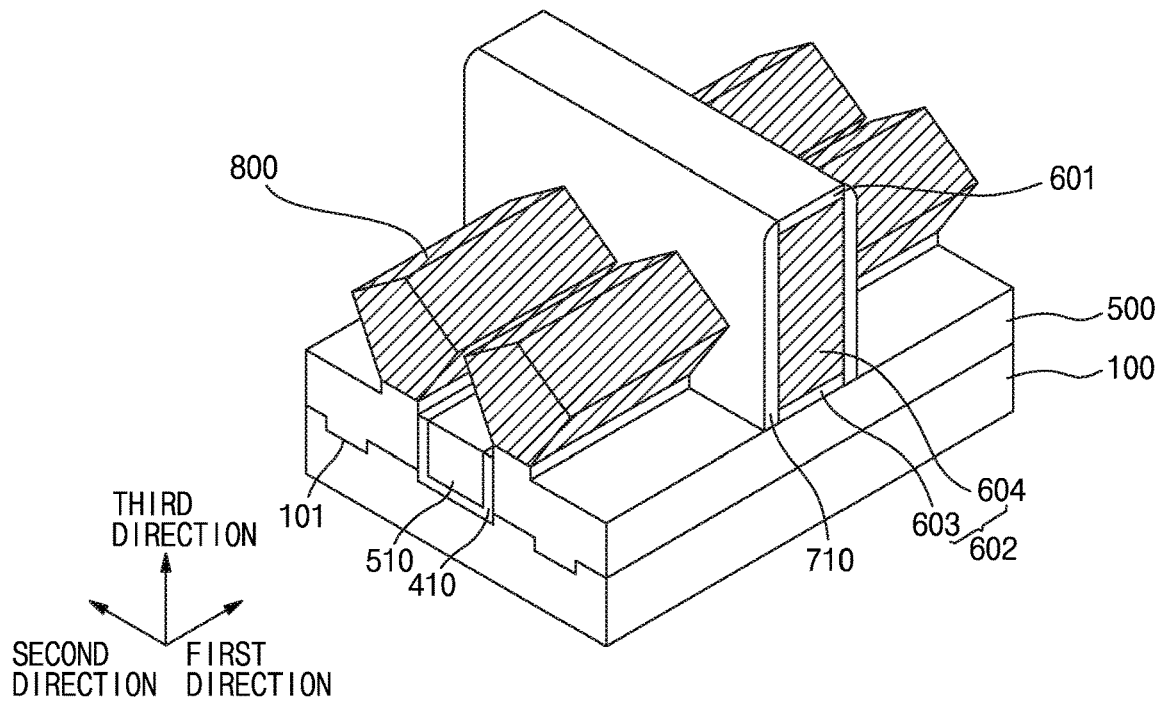

Referring to FIG. 25, source and drain patterns 800 may be formed on the recess 500r, and may be formed on both sides of the dummy gate pattern 602. Thus, the first isolation layer 500 may include protrusions (recesses 500r) formed to be spaced apart from each other in the second direction, and the source and drain patterns 800 may be formed on the protrusions (recesses 500r). The source and drain patterns 800 may be formed using the wire pattern 222 as a seed layer, but the present inventive concept is not limited thereto. The source and drain patterns 800 may be formed to cover the inner spacers 720, and may be in contact with the inner spacers 720. The source and drain patterns 800 may be formed by an epitaxial growth process. A material of an epi layer included in the source and drain patterns 800 may vary depending on whether the semiconductor device according to the embodiment of the present inventive concept is an n-type transistor or a p-type transistor. Further, when necessary, the epi layer may be in-situ doped with impurities during the epitaxial growth process. Alternatively, the doping of the epi layer may be carried out after the epitaxial growth process with an ion implantation process.

Figure 26:
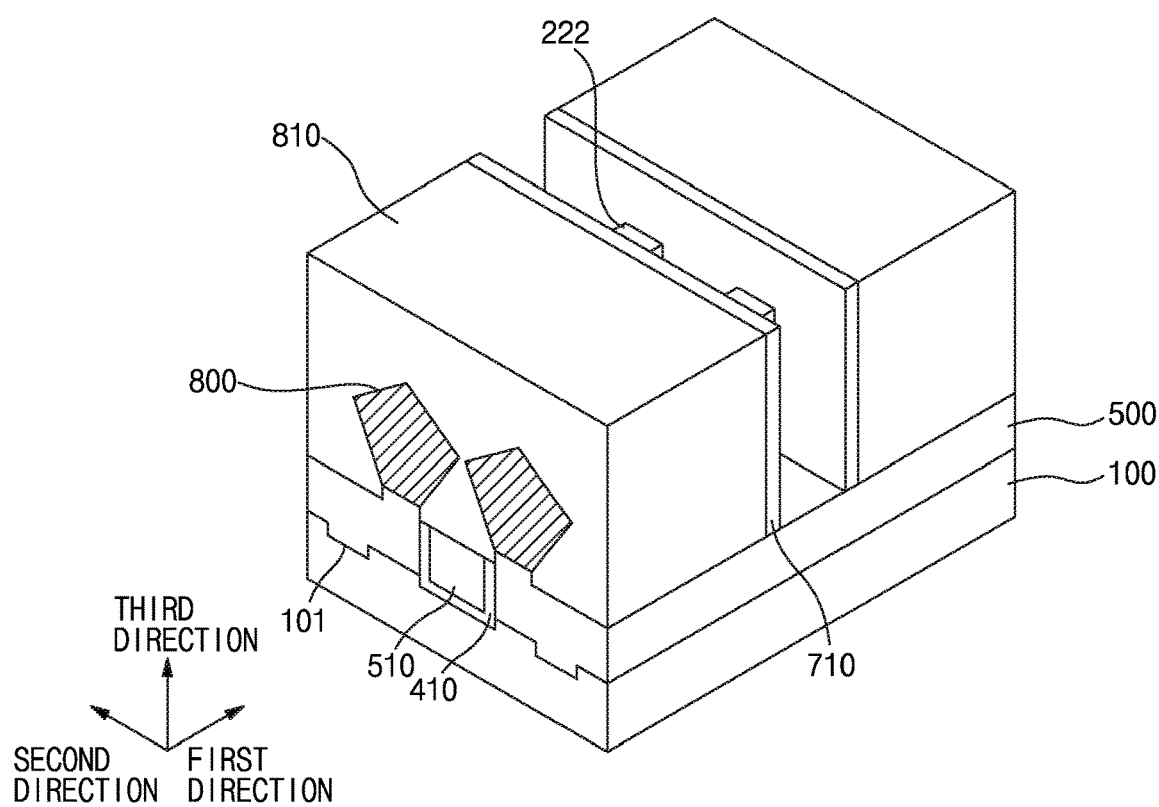
Figure 27:
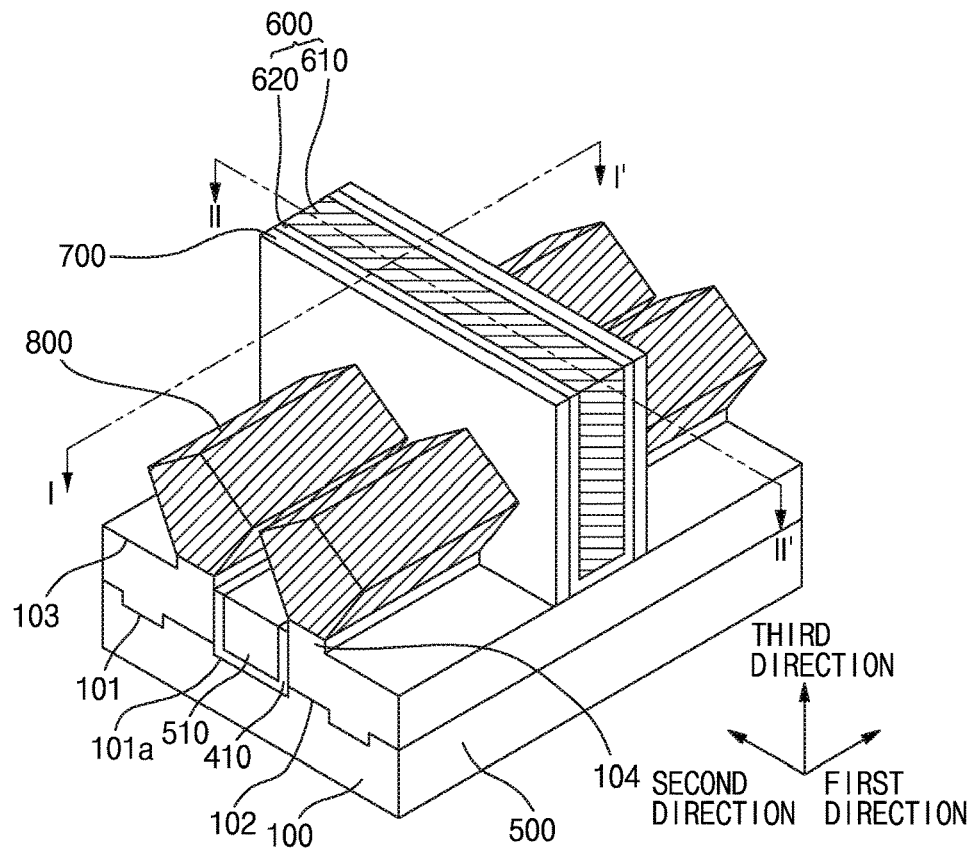
Figure 28:
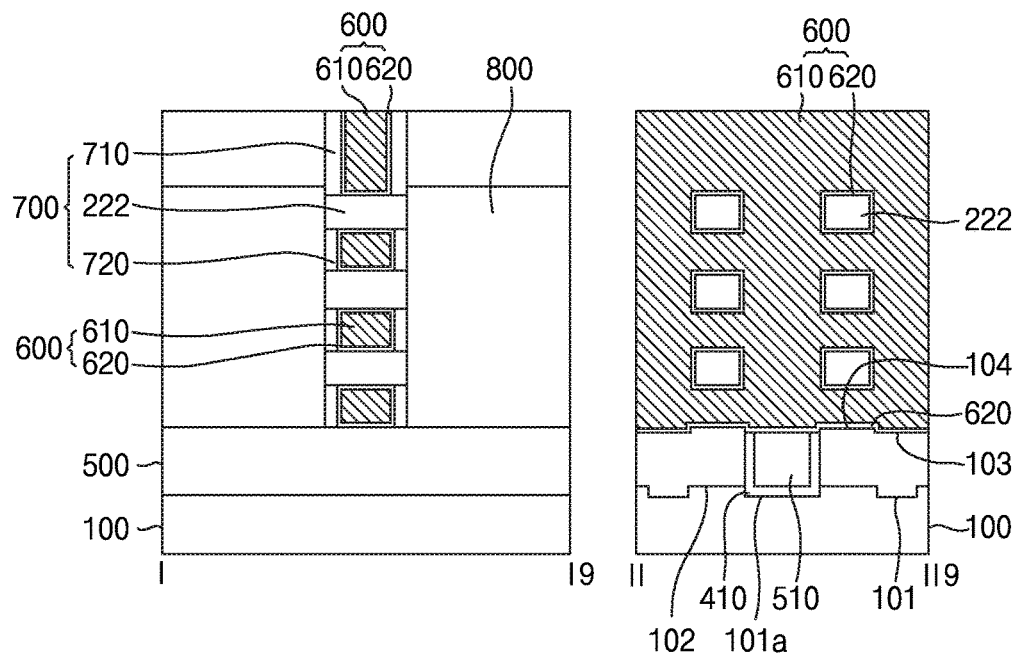
FIG. 28 shows cross-sectional views taken along lines I-I' and II-II' of the semiconductor device of FIG. 27.

Referring to FIGS. 26 to 28, an interlayer insulating film 810 may be formed on the first isolation layer 500 and the second isolation layer 510 to cover the source and drain patterns 800, the gate spacers 700 (the outer spacers 710 and the inner spacers 720), and the dummy gate pattern 602.

The interlayer insulating film 810 may include at least one of a low-k dielectric material, an oxide film, a nitride film, and an oxynitride film. The low-k dielectric material may include, for example, flowable oxide (FOX), tonen silazene (TOSZ), undoped silica glass (USG), borosilica glass (BSG), phosphosilica glass (PSG), borophosphosilica glass (BPSG), plasma-enhanced tetra ethyl ortho silicate (PE-TEOS), fluoride silicate glass (FSG), high-density plasma (HDP) oxide, plasma-enhanced oxide (PEOX), flowable chemical vapor deposition (FCVD) oxide, or a combination thereof.

Thereafter, the interlayer insulating film 810 may be planarized until a top surface of the dummy gate electrode 604 is exposed. As a result, the mask layer 601 may be removed, and the top surface of the dummy gate electrode 604 may be exposed.

The dummy gate pattern 602, namely, the dummy gate insulating film 603 and the dummy gate electrode 604, may be removed. By removing the dummy gate insulating film 603 and the dummy gate electrode 604, the fin-type structure 220 which overlaps the first isolation layer 500, the first isolation layer 500, the second isolation layer 510, and the first liner 410, may be exposed. That is, the first semiconductor pattern 221 and the second semiconductor pattern (or the wire pattern) 222, which overlaps the dummy gate pattern 602, may be exposed.

Subsequently, the first semiconductor pattern 221 may be removed. Thus, a space may be formed between the wire patterns 222. Further, a space may be formed between the first isolation layer 500 and the wire pattern 222. In addition, the first semiconductor pattern 221 may be removed to expose the inner spacers 720 of the gate spacers 700.

Thereafter, a gate dielectric layer 620 may be formed on a circumference of the wire pattern 222 and exposed top surfaces of the first isolation layer 500, the second isolation layer 510, and the first liner 410. In addition, the gate dielectric layer 620 may also be formed on the exposed sidewalls of the inner spacers 720 and outer spacers 710.

Subsequently, a gate electrode 610 may be formed to surround the wire pattern 222 and extend in the second direction. The gate electrode 610 may be a replacement metal gate electrode. The gate dielectric layer 620 may be formed of a material having a high dielectric constant (high-k).

Referring to FIGS. 27 and 28, the semiconductor device according to the embodiment of the present inventive concept may include a substrate 100, a first isolation layer 500, a second isolation layer 510, and a wire pattern 222. Further, the semiconductor device according to the embodiment of the present inventive concept may include a wire pattern 222, a gate pattern 600, gate spacers 700, and source and drain patterns 800. The semiconductor device according to the embodiment of the present inventive concept may be an MBCFET.

The substrate 100 may be provided in a lower portion of the semiconductor device. According to an exemplary embodiment of the present inventive concept, a top surface of the substrate 100 may have a concave-convex shape. A top surface in the concave-convex shape may include concave units 101 and 101a and a convex unit 102. A width and depth of the concave units 101 and 101a may be the same as or different from a width and depth of the convex unit 102.

The first isolation layer 500, the second isolation layer 510, and a liner 410 may be alternately formed on the substrate 100 in a second direction. The liner 410 may be interposed between the first isolation layer 500 and the second isolation layer 510. The first isolation layer 500, the second isolation layer 510, and the liner 410 may be repeatedly formed on the substrate 100 in the second direction in the order of the first isolation layer 500, the liner 410, the second isolation layer 510, the liner 410, and the first isolation layer 500. Thus, the liner 410 may overlap spaces, which are repeatedly formed in the second direction between two adjacent wire patterns 222, in a third direction perpendicular to the first and second directions.

The first isolation layer 500 may be formed on the substrate 100 to be in contact with the substrate 100. Thus, a bottom surface of the first isolation layer 500 may have a concave-convex shape corresponding to the shape of the top surface of the substrate 100. For example, the bottom surface of the first isolation layer 500 may have a convex shape corresponding to the concave unit 101 of the substrate 100, and a concave shape corresponding to the convex unit 102 of the substrate 100. Further, the top surface of the first isolation layer 500 may also have a concave-convex shape. The top surface of the first isolation layer 500 may include a concave unit 103 and a convex unit 104. In addition, the bottom surface of the first isolation layer 500 may also include a concave unit and a convex unit. According to an exemplary embodiment of the present inventive concept, the concave unit 103 of the top surface of the first isolation layer 500 may be formed to have a width greater than that of the concave unit 101 of the substrate 100 at the bottom surface of the first isolation layer 500.

The first isolation layers 500 may be formed to be spaced apart from each other in the second direction. A distance by which the first isolation layers 500 are spaced apart from each other may be smaller than a width W1 of mandrel patterns (see, e.g., 301 of FIG. 7) used in the above-described method of manufacturing the semiconductor device. The distance by which the first isolation layers 500 are spaced apart from each other may correspond to the width W2 of the first sacrificial layer pattern 201c shown in FIG. 6. The width W2 of the first sacrificial layer pattern 201c may be smaller than the width W1 of the mandrel patterns 301 as described above with reference to FIG. 6. The first isolation layer 500 may be formed of oxide, but the present inventive concept is not limited thereto.

The second isolation layer 510 may be formed between the first isolation layers 500, which are spaced apart from each other. The second isolation layer 510 may be formed to be spaced apart from the first isolation layers 500. Further, the second isolation layer 510 may be formed on the substrate 100 spaced apart from the substrate 100 with the liner 410 interposed therebetween.

A width of the second isolation layer 510 may be smaller than the distance between the first isolation layers 500. A level of a top surface of the second isolation layer 510 may be lower than a level of the convex unit 104 of the top surface of the first isolation layer 500. The level of the top surface of the second isolation layer 510 may be equal to a level of the concave unit 103 of the first isolation layer 500. The second isolation layer 510 may be formed of a material the same as that of the first isolation layer 500, but the present inventive concept is not limited thereto.

The liner 410 may be formed on the substrate 100 to be in contact with the substrate 100. Further, the liner 410 may be formed between the first isolation layers 500, which are spaced apart from each other. Side surfaces of the liner 410 may be in contact with side surfaces of the first isolation layer 500.

A cross-section (as shown in FIG. 28) of the liner 410 may have a U shape. The liner 410 having the U shape may have an outer side surface and an inner side surface. The outer side surface of the liner 410 having the U shape may be in contact with the substrate 100 and the first isolation layer 500, and the inner side surface of the liner 410 having the U shape may be in contact with the second isolation layer 510. The liner 410 may surround side surfaces and a bottom surface of the second isolation layer 510 formed on the inner side surface of the liner 410. The liner 410 may be formed of nitride, but the present inventive concept is not limited thereto.

The wire pattern 222 may be the second semiconductor pattern 222 shown in FIG. 11. Alternatively, the wire pattern 222 may be the second semiconductor pattern 262 shown in FIG. 20. The wire pattern 222 may be formed above the first isolation layer 500 to be spaced apart from the first isolation layer 500, and may be formed to be above and spaced apart from the convex unit 104 of the top surface of the first isolation layer 500. The wire pattern 222 may be formed to extend in a first direction.

The wire pattern 222 may be used as a channel region of the semiconductor device. The wire pattern 222 may include a material the same as that of the substrate 100. For example, the wire pattern 222 may include silicon (Si).

The gate pattern 600 may be formed to be above the first isolation layer 500, and may be formed to surround a circumference of the wire pattern 222. The gate pattern 600 may also be formed in a space between the first isolation layer 500 and the wire pattern 222, and may include a gate electrode 610 and a gate dielectric layer 620.

The gate electrode 610 may be formed to be above and spaced apart from the first isolation layer 500, and may be formed to surround the circumference of the wire pattern 222.

The gate electrode 610 may include a conductive material, for example, a metal. Although the gate electrode 610 includes a single layer, the present inventive concept is not limited thereto. Alternatively, the gate electrode 610 may include silicon (Si) and silicon germanium (SiGe) instead of a metal. The gate electrode 610 may be formed by a replacement process. For example, the gate electrode 610 may be a replacement metal gate electrode.

The gate dielectric layer 620 may be formed between the gate electrode 610 and the wire pattern 222. Further, the gate dielectric layer 620 may be formed between the gate electrode 610 and the first isolation layer 500, and may also be formed along a circumference of the wire pattern 222.

The gate dielectric layer 620 may be formed to be in contact with the wire pattern 222. Further, the gate dielectric layer 620 may be formed along top surfaces of the first isolation layer 500, the second isolation layer 510, and the liner 410. Thus, the gate dielectric layer 620 may include a cross-section (as shown in FIG. 28) having a concave-convex shape under the gate electrode 610. The gate dielectric layer 620 may be formed of a high-k dielectric.

The gate spacers 700 may be formed on the first isolation layer 500, the second isolation layer 510, and the liner 410, which may extend in the first direction. Further, the gate spacers 700 may be formed on both sidewalls of the gate pattern 600 that extends in the second direction. The gate spacers 700 may be formed to be in contact with the gate dielectric layer 620, and may be formed on upper and lower sides of the wire pattern 222 and face each other.

The gate spacers 700 may match both ends of the wire pattern 222. Each of the gate spacers 700 may include a through hole. The wire pattern 222 may pass through the gate spacers 700 through the through hole. The gate spacers 700 may be in entire contact with circumferences of the ends of the wire pattern 222.

The gate spacers 700 may include outer spacers 710 and inner spacers 720. The outer spacers 710 may be in contact with the wire pattern 222. The inner spacers 720 may be formed between the wire pattern 222 and the first isolation layer 500 and may be in contact with the top surface of the first isolation layer 500. In a cross-section taken along the outer spacer 710 in the second and third directions, the inner spacer 720 may be surrounded by the wire pattern 222 and the outer spacer 710. Alternatively, the inner spacer 720 may be surrounded by the wire pattern 222, the outer spacer 710, and the first isolation layer 500.

The outer spacers 710 may include a material different from a material of the inner spacers 720. That is, the outer spacers 710 may have a dielectric constant different from a dielectric constant of the inner spacers 720.

The source and drain patterns 800 may be formed on both sides of the gate spacers 700, and may be formed on the first isolation layer 500. The source and drain patterns 800 may be formed to be in contact with the convex unit 104 of the top surface of the first isolation layer 500.

An outer circumferential surface of each of the source and drain patterns 800 may have various shapes. For example, the outer circumferential surface of each of the source and drain patterns 800 may have at least one of, for example, a diamond shape, a circular shape, a rectangular shape and an octagonal shape.

The source and drain patterns 800 may be in direct contact with the wire pattern 222 used as the channel region. That is, the source and drain patterns 800 may be in direct contact with the wire pattern 222 formed through the through holes of the gate spacers 700.

As shown in FIGS. 27 and 28, an electrical isolation by interposing the first isolation layer 500 between the wire pattern 222 and the substrate 100 may be established to secure the performance of the MBCFET according to the exemplary embodiment of the present inventive concept described above.

FIGS. 29 to 38 are cross-sectional views of intermediate operations for describing a method of manufacturing a semiconductor device according to an exemplary embodiment of the present inventive concept. The description of components of the present exemplary embodiment that are the same as those of the method of manufacturing the semiconductor device described above with reference to FIGS. 1 to 20 will be omitted or simplified.

Figure 29:
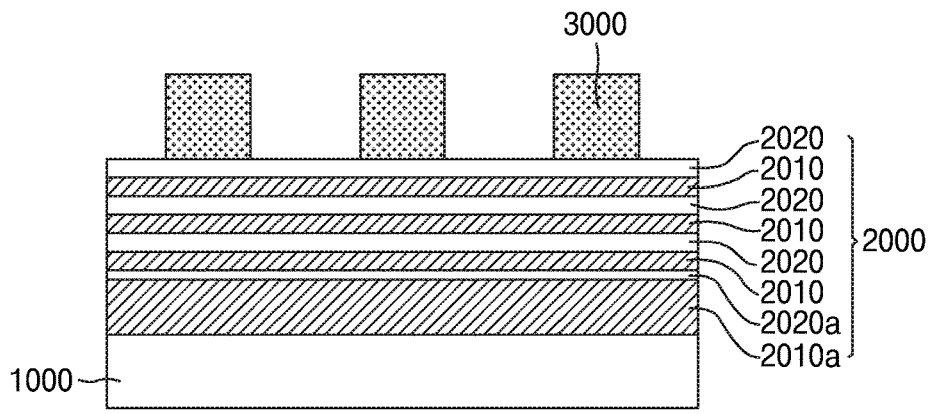
FIGS. 29 to 38 are cross-sectional views of intermediate operations for describing a method of manufacturing a semiconductor device according to an exemplary embodiment of the present inventive concept.
Figure 30:
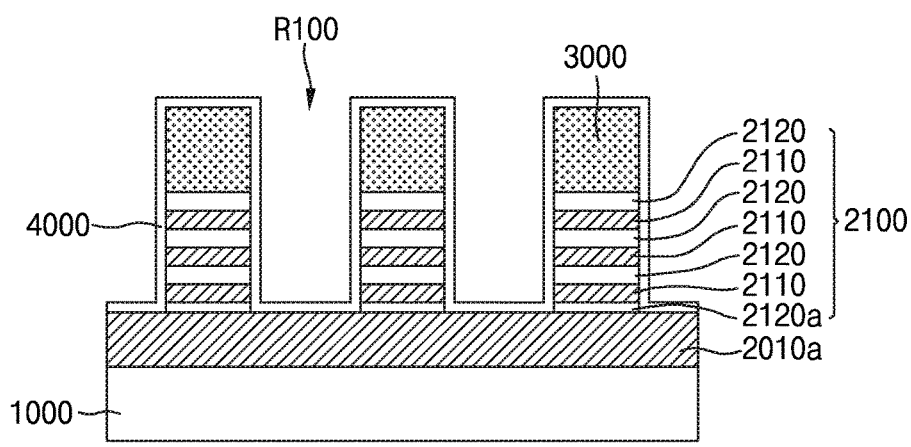

Referring to FIGS. 29 and 30, a stacked body 2000 includes a first sacrificial layer 2010a, a second sacrificial layer 2020a and first semiconductor layers 2010 and second semiconductor layers 2020. The stacked body 2000 formed on a substrate 1000 may be etched so that fin-type structures 2100 may be formed on the first sacrificial layer 2010a. The fin-type structures 2100 include a second sacrificial layer pattern 2120a and include first semiconductor patterns 2110 and second semiconductor patterns 2120 stacked alternately on a second sacrificial layer pattern 2120a. That is, the second sacrificial layer pattern 2120a in the fin-type structure may be the lowest layer. A first recess R100 may be formed between the fin-type structures 2100. Thereafter, a first liner 4000 may be conformally formed on the substrate 1000 to cover both sidewalls of each of the fin-type structures 2100. Although the process of FIGS. 29 and 30 is the same as the process described with reference to FIGS. 1 and 3, mask patterns 3000 may be used as an etch mask instead of mandrel patterns 301 and spacer patterns 302 as shown in FIGS. 1 and 3. In the below process which will be described with reference to FIGS. 1 to 20, it is assumed that the mask patterns 3000 are used as an etch mask instead of the mandrel patterns 301 and the spacer patterns 302 as shown in FIGS. 1 and 3.

Figure 31:
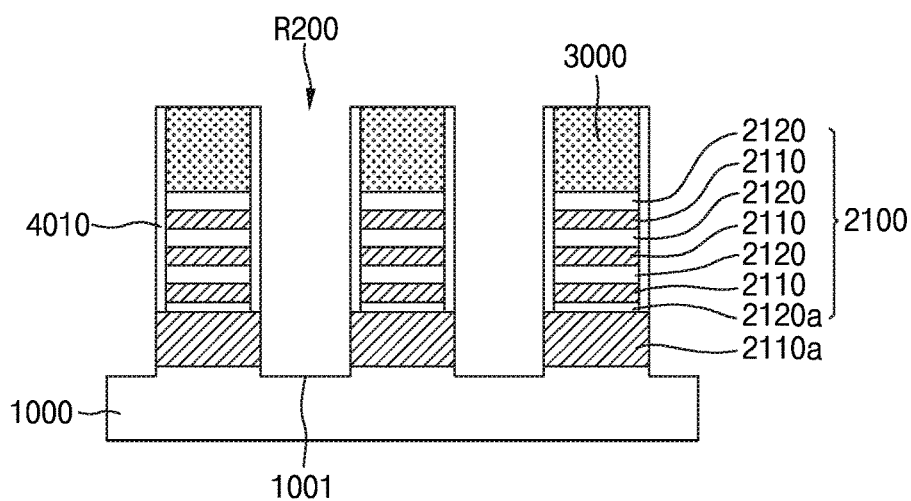

Referring to FIG. 31, the first recess R100 may extend downward to form a second recess R200. For example, the first liner 4000 and the first sacrificial layer 2010a may be anisotropically etched under the first recess R100 until a top surface of the substrate 1000 is exposed, thereby forming the second recess R200 and liner patterns 4010. A portion of the substrate 1000 may be etched during the forming of the second recess R200. Thus, a concave unit 1001 having a concave top surface may be formed in the top portion of the substrate 1000. The process of FIG. 31 may be the same as the process described with reference to FIG. 4.

Figure 32:
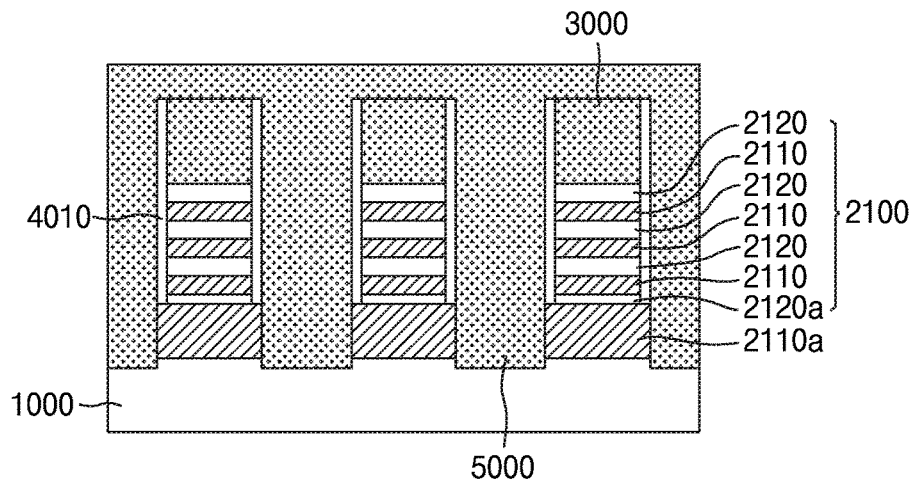

Referring to FIG. 32, a first isolation layer 5000 may be formed to fill the second recess R200. That is, the first isolation layer 5000 may be formed between the first sacrificial layer patterns 2110a and between the fin-type structures 2100. The process of FIG. 32 may be the same as the process described with reference to FIG. 6.

Figure 33:
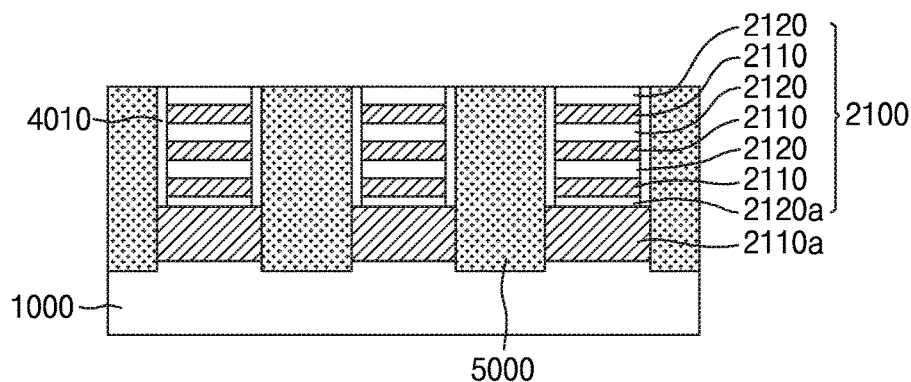

Referring to FIG. 33, the first isolation layer 5000 may be planarized to expose top surfaces of the fin-type structures 2100. In addition to the first isolation layer 5000, the mask pattern 3000 and a pattern of the liner patterns 4010 may be planarized so that top surfaces of the first isolation layer 5000, the fin-type structure 2100, and the liner patterns 4010 may be at the same level. The mask pattern 3000 may be removed during the planarization process. For example, the exposed top surface of the fin-type structure 2100 may be a top surface of a second semiconductor pattern 2120.

Figure 34:
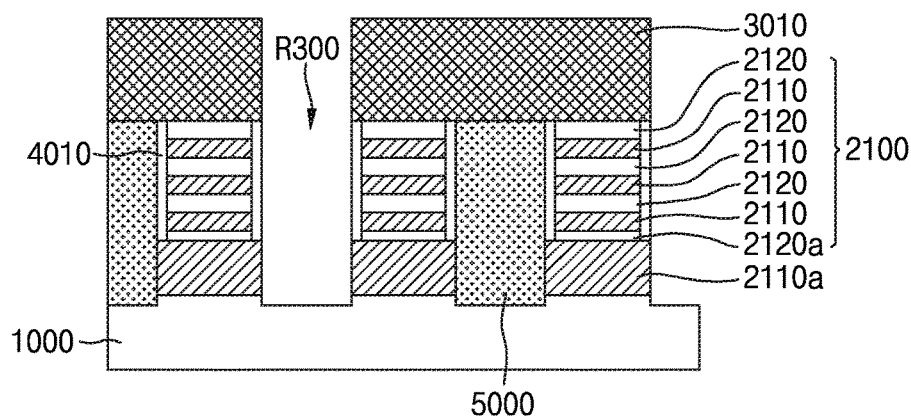

Referring to FIG. 34, a portion of the first isolation layer 5000 may be removed to form a recess R300 in one of two neighboring second recesses R200. For example, a mask pattern 3010 may be formed on top surfaces of the second recesses R200 excluding the portions of the second recesses R200 for forming the recess R300, top surfaces of the fin-type structure 2100, and top surfaces of liner patterns 4010, and the first isolation layer 5000 may be etched using the mask pattern 3010 as an etch mask.

The recess R300 in which the vacant space is formed may be an odd recess or an even recess in one direction in which the fin-type structures 2100 are spaced apart from each other. Thus, the first isolation layer 5000 may be necessarily formed in any one of two neighboring recesses R300 formed on both sides of one fin-type structure 2100, and the vacant space may be formed in the other one of the two neighboring recesses R300.

Figure 35:
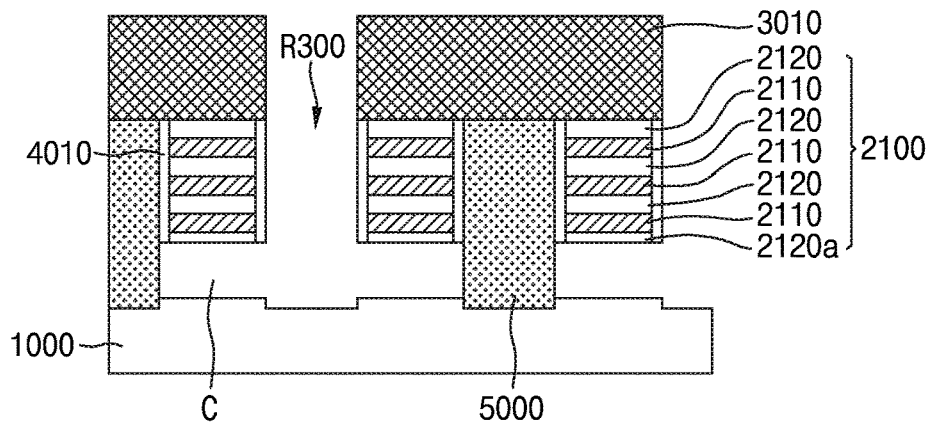
Figure 36:
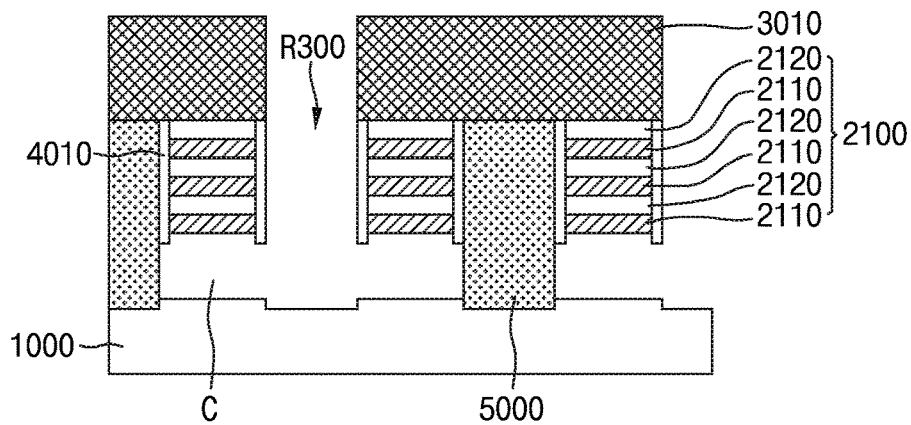

Referring to FIGS. 35 and 36, the first sacrificial layer pattern 2110a may be removed through the recess R300 in which the vacant space is formed. Thereafter, a second sacrificial layer pattern 2120a having an exposed bottom surface may be removed. Thus, a first semiconductor layer 2110 may be exposed at a bottom surface of the fin-type structure 2100. Further, a vacant space C may be formed between the fin-type structure 2100 and the substrate 1000. The processes of removing the first sacrificial layer pattern 2110a and the second sacrificial layer pattern 2120a as shown in FIGS. 35 and 36 may be the same as the process of removing the first sacrificial layer pattern 251b and the second sacrificial layer pattern 252b described above with reference to FIG. 18.

Figure 37:
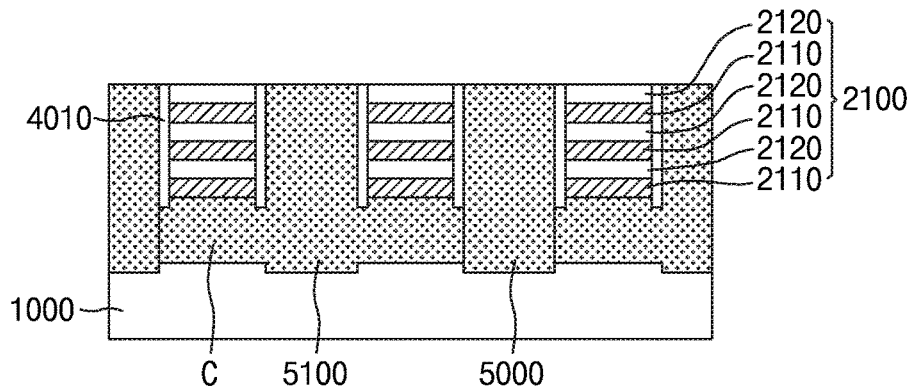

Referring to FIG. 37, a second isolation layer 5100 may be formed to fill the vacant space C between the fin-type structure 2100 and the substrate 1000 and the recess R300 in which the vacant space is formed. The second isolation layer 5100 may be planarized to expose top surfaces of the fin-type structures 2100. The mask pattern 3010 may be removed during the planarization process. A top surface of the second isolation layer 5100 may then be formed at a level the same as that of the top surface of the fin-type structure 2100.

Figure 38:
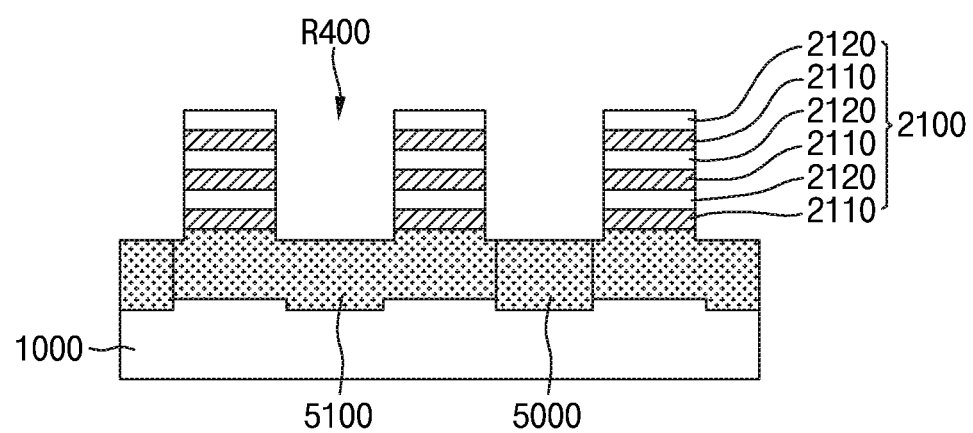

Referring to FIG. 38, the first isolation layer 5000, the second isolation layer 5100, and the liner patterns 4010 may be etched to expose both sidewalls of the fin-type structure 2100. The process of exposing the sidewalls of the fin-type structure 2100 as shown in FIG. 38 may be the same as the process of exposing the sidewalls of the fin-type structure 220 described above with reference to FIG. 11. Thus, an electrical isolation by interposing the second isolation layer 5100 between the fin-type structures 2100 and the substrate 1000 may be established to secure the performance of a semiconductor device, for example, an MBCFET, in the method of manufacturing the semiconductor device according to the exemplary embodiment of the present inventive concept described above.

While the present inventive concept has been shown and described with reference to exemplary embodiments thereof, it will be understood by those of ordinary skill in the art that the present inventive concept may be implemented in other specific forms without departing from the spirit and scope thereof as defined by the following claims. It should be understood that the above-described exemplary embodiments are not restrictive but illustrative in every respect.

What is claimed is:

1. A method of manufacturing a semiconductor device, the method comprising:
   forming a stacked body in which first semiconductor layers and second semiconductor layers are alternately stacked on a substrate;
   forming fin-type structures on a first sacrificial layer by partially etching the stack body;
   forming a liner covering the first sacrificial layer and the fin-type structures;
   forming liner patterns and sacrificial patterns by etching portions of the liner and portions of the first sacrificial layer;
   forming a first isolation layer covering the substrate, the first sacrificial patterns and the liner patterns;
   forming first recesses exposing the sacrificial patterns by etching portions of the first isolation layer;
   forming second recesses including vacant spaces between the substrate and the fin-type structures by removing the sacrificial patterns through the first recesses;
   etching portions of the fin-type structures through the second recesses;
   forming second isolation layers filling the second recesses; and
   exposing the fin-type structures by removing the liner patterns and by etching portions of each of the first isolation layer and the second isolation layers.

2. The method of claim 1, wherein the first sacrificial layer is a lowermost layer among the first semiconductor layers and the second semiconductor layers included in the stacked body, and is thicker than other first semiconductor layers and the second semiconductor layers.

3. The method of claim 1, wherein the forming of the fin-type structures comprises:
forming mask patterns on the stacked body; and
etching the stack body by using the mask patterns as an etch mask and by using the first sacrificial layer as an etch stop layer.

4. The method of claim 3, wherein the forming of the first recesses comprises:
exposing top surfaces of the fin-type structures by removing the mask patterns through a planarization process.

5. The method of claim 1, wherein the fin-type structures comprise a first fin-type structure, a second fin-type structure and a third fin-type structure that are sequentially and adjacently disposed in one direction, and
the forming of the first recesses comprises:
removing a portion of the first isolation layer between the first fin-type structure and the second fin-type structure; and
not removing a portion of the first isolation layer between the second fin-type structure and the third fin-type structure.

6. The method of claim 1, wherein the forming of the liner patterns and the sacrificial patterns comprises:
forming convex units by etching portions of the substrate.

7. The method of claim 1, wherein the etching of the portions of the fin-type structures comprises:
removing a second sacrificial layer, which is a lowermost layer among the first semiconductor layers and the second semiconductor layers included in the fin-type structures.

8. The method of claim 1, wherein the exposing of the fin-type structures comprises:
forming convex units by etching the portions of the first isolation layer and the portions of the second isolation layers.

9. A method of manufacturing a semiconductor device, the method comprising:
forming sacrificial layer patterns spaced apart from each other on a substrate, fin-type structures disposed on each of the sacrificial layer patterns, and liner patterns covering sidewalls of the fin-type structures;
forming first device isolation layers in contact with the substrate, the sacrificial layer patterns, and the liner patterns;
forming recesses exposing the substrate, lower surfaces of the fin-type structures, and the liner patterns;
partially etching the fin-type structures through the recesses;
forming second device isolation layers filling the recesses; and
removing the liner patterns and partially etching the first device isolation layers and the second device isolation layers to expose the fin-type structures.

10. The method of claim 9, wherein the forming of the sacrificial layer patterns, the fin-type structures, and the liner patterns comprises:
forming a stacked body in which first semiconductor layers and second semiconductor layers are alternately stacked on the substrate; and
forming the fin-type structures on a first sacrificial layer by partially etching the stacked body.

11. The method of claim 10, wherein the first sacrificial layer is a lowermost layer among the first semiconductor layers and the second semiconductor layers included in the stacked body, and is thicker than other first semiconductor layers and the second semiconductor layers.

12. The method of claim 10, wherein the forming of the fin-type structures comprises:
forming mask patterns on the stacked body; and
etching the stacked body by using the mask patterns as an etch mask and by using the first sacrificial layer as an etch stop layer.

13. The method of claim 12, wherein the forming of the recesses comprises:
exposing top surfaces of the fin-type structures by removing the mask patterns through a planarization process.

14. The method of claim 10, wherein the forming of the sacrificial layer patterns, the fin-type structures, and the liner patterns comprises:
forming a liner covering the first sacrificial layer and the fin-type structures; and
forming the liner patterns and the sacrificial layer patterns by partially etching the liner and the first sacrificial layer.

15. The method of claim 14, wherein the forming of the liner patterns and the sacrificial layer patterns comprises:
forming convex units by etching portions of the substrate.

16. The method of claim 10, wherein the partially etching of the fin-type structures through the recesses comprises:
removing a second sacrificial layer, which is a lowermost layer among the first semiconductor layers and the second semiconductor layers included in the fin-type structures.

17. The method of claim 9, wherein the forming of the recesses comprises:
exposing the sacrificial layer patterns by partially etching the first device isolation layers; and
forming vacant spaces between the substrate and the fin-type structures by removing the sacrificial patterns.

18. The method of claim 9, wherein the exposing of the fin-type structures comprises:
forming convex units by partially etching the first device isolation layers and the second device isolation layers.

19. A method of manufacturing a semiconductor device, the method comprising:
forming a stacked body in which first semiconductor layers and second semiconductor layers are alternately stacked on a substrate;
forming mask patterns on the stacked body;
forming fin-type structures on a first sacrificial layer by partially etching the stacked body using the mask patterns as an etch mask and using the first sacrificial layer as an etch stop layer;
forming a liner covering the first sacrificial layer and the fin-type structures;
forming liner patterns and sacrificial layer patterns by partially etching the liner and the first sacrificial layer;
forming a first device isolation layer covering the substrate, the sacrificial layer patterns, the liner patterns, and the mask patterns;
exposing top surfaces of the fin-type structures by removing a portion of the first isolation layer and the mask pattern;
forming first recesses exposing the sacrificial layer patterns by partially etching the first device isolation layer;
removing the sacrificial layer patterns through the first recesses to form second recesses including vacant spaces between the fin-type structures and the substrate;
removing a second sacrificial layer that is a lowermost layer among the first semiconductor layers and the second semiconductor layers included in the fin-type structures through the second recesses;

forming second device isolation layers filling the second recesses; and removing the liner patterns and partially etching the first device isolation layer and the second device isolation layers to expose the fin-type structures.

20. The method of claim 19, wherein the forming of the liner patterns and the sacrificial layer patterns comprises:

forming convex units on the substrate by partially etching the substrate.

* * * * *